(12) United States Patent
Wang et al.

(10) Patent No.: US 12,219,882 B2
(45) Date of Patent: Feb. 4, 2025

(54) MEMORY CELL WITH LOW RESISTANCE TOP ELECTRODE CONTACT AND METHODS FOR FORMING THE SAME

(71) Applicant: Taiwan Semiconductor Manufacturing Company Limited, Hsinchu (TW)

(72) Inventors: Hsing-Hsiang Wang, Hsinchu (TW); Yu-Feng Yin, Hsinchu County (TW); Jiann-Horng Lin, Hsinchu (TW); Huan-Just Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 205 days.

(21) Appl. No.: 17/230,640

(22) Filed: Apr. 14, 2021

(65) Prior Publication Data

US 2021/0399207 A1    Dec. 23, 2021

Related U.S. Application Data

(60) Provisional application No. 63/042,585, filed on Jun. 23, 2020.

(51) Int. Cl.
  *H10N 50/80* (2023.01)
  *H10B 61/00* (2023.01)
  *H10N 50/01* (2023.01)

(52) U.S. Cl.
  CPC ............ *H10N 50/80* (2023.02); *H10B 61/22* (2023.02); *H10N 50/01* (2023.02)

(58) Field of Classification Search
  CPC ........ H10N 50/80; H10N 50/01; H10N 50/10; H10B 61/22
  See application file for complete search history.

(56) References Cited

U.S. PATENT DOCUMENTS

| 10,644,231 B2 * | 5/2020 | Peng ................. H10N 50/80 |
| 2008/0191251 A1 * | 8/2008 | Ranjan ............... G11C 11/161 |
| | | 257/295 |
| 2013/0026585 A1 | 1/2013 | Sung et al. |
| 2013/0032775 A1 | 2/2013 | Satoh et al. |

(Continued)

FOREIGN PATENT DOCUMENTS

| CN | 110010759 A | 7/2019 |
| TW | 201724444 A | 7/2017 |
| TW | 201913960 A | 4/2019 |

OTHER PUBLICATIONS

Chinese Patent and Trademark Office, CN Application No. 202110655689.1; Office Action of Jul. 23, 2024; 24 pages.

(Continued)

*Primary Examiner* — Kimberly N Rizkallah
*Assistant Examiner* — Zhijun Xu
(74) *Attorney, Agent, or Firm* — The Marbury Law Group, PLLC

(57) ABSTRACT

A magnetic tunnel junction (MTJ) memory cell comprising a connection via structure, a bottom electrode disposed on the connection via structure, a memory material stack disposed on the bottom electrode, and a conductive contact structure disposed on the memory material stack, in which a bottom surface of the conductive contact structure is in direct contact with a memory material layer of the memory material stack.

20 Claims, 25 Drawing Sheets

(56) References Cited

U.S. PATENT DOCUMENTS

| | | | |
|---|---|---|---|
| 2016/0240429 A1* | 8/2016 | Engelhardt | H01L 21/31144 |
| 2016/0268499 A1* | 9/2016 | You | H10N 50/01 |
| 2017/0194557 A1* | 7/2017 | Chuang | H10B 61/22 |
| 2018/0358547 A1* | 12/2018 | Yang | H10B 61/10 |
| 2019/0148633 A1* | 5/2019 | Dai | H10N 50/01 |
| | | | 257/421 |
| 2019/0165258 A1* | 5/2019 | Peng | H10N 50/80 |
| 2020/0028080 A1* | 1/2020 | Ando | H10N 70/8836 |
| 2020/0075669 A1 | 3/2020 | Chuang et al. | |
| 2020/0161542 A1 | 5/2020 | Ahn et al. | |

OTHER PUBLICATIONS

Chinese Patent and Trademark Office, CN Application No. 202110655689.1; Notice of Allowance of Dec. 9, 2024; 8 pages.

* cited by examiner

MEMORY CELL WITH LOW RESISTANCE TOP ELECTRODE CONTACT AND METHODS FOR FORMING THE SAME

RELATED APPLICATIONS

This application claims priority to U.S. Provisional Patent Application No. 63/042,585 entitled "A Method to Reduce the Resistance of embedded MRAM by Improving the Structure of Top Electrode Trench" filed on Jun. 23, 2020, the entire contents of which are hereby incorporated by reference for all purposes.

BACKGROUND

MRAM is a type of non-volatile random access memory (NV RAM) that stores data in magnetic domains. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. If the insulating layer is thin enough (typically a few nanometers), electrons can tunnel from one ferromagnet into the other. This configuration is known as a magnetic tunnel junction (MTJ) and is the simplest structure for an MRAM bit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
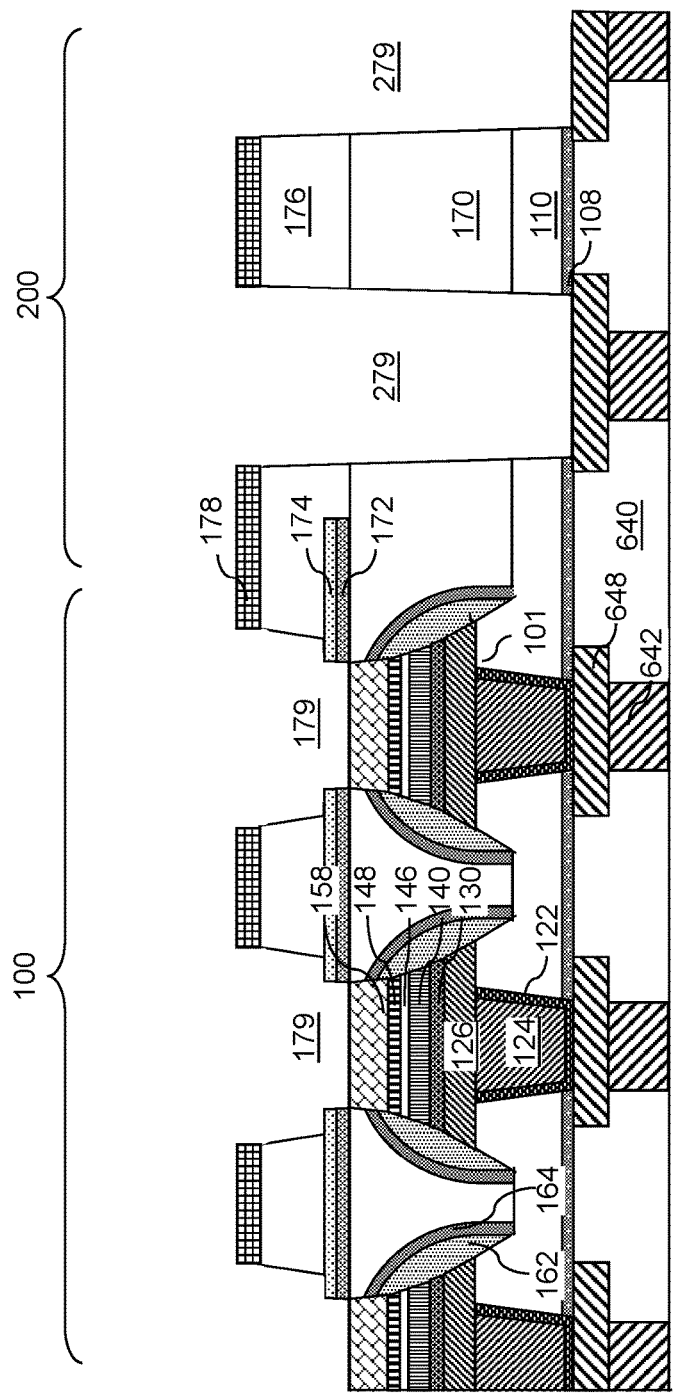
FIG. 1 illustrates a vertical cross-sectional view of a magnetic tunnel junction (MTJ) structure after etching through exposed portions of first and second etch stop layers to expose top electrodes.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to form a memory cell and/or an array of memory cells. Specifically, the structures and methods of the present disclosure may be used to form a magnetic tunnel junction memory cell and/or an array of magnetic tunnel junction memory cells. While the present disclosure is described using an exemplary structure including magnetic tunnel junction memory cells, the methods of the present disclosure may be used to form any memory cell or any array of memory cells including a vertical stack of patterned material portions that constitutes a memory cell and containing a top electrode.

It is to be understood that the memory devices according to embodiments of the present disclosure may comprise a single discrete memory cell, a one-dimensional array of memory cells, or a two-dimensional array of memory cells. It is also to be understood that a one-dimensional array of memory cells of the present disclosure may be implemented as a periodic one-dimensional array of memory cells, and a two-dimensional array of memory cells of the present disclosure may be implemented as a periodic two-dimensional array of memory cells. In addition, while present disclosure is described using an embodiment in which a two-dimensional array of memory cells is formed within a specific metal interconnect level, embodiments are expressly contemplated herein in which the two-dimensional array of memory cells is formed within different metal interconnect levels.

Resistance reduction is a critical development for embedded magnetoresistive random-access memory (MRAM) designs and manufacturing processes. Top electrodes of a MTJ memory cell within a MTJ structure may act as an important hard mask for MTJ patterning and the connection with an upper trench (i.e. contact formed from metallic fill material layer e.g., bit line). However, this manufacturing process contributes extra resistance to the MTJ functioning pathway, such that copper (Cu) material filling in a bottom shrink trench connecting with a top electrode comprised of TiN induces a high resistance. In addition, due to the smaller dimensions of the bottom shrink trench, the filling of the bottom shrink trench portion may result in Cu filling pit risks. Put another way, the contrast in lateral dimensions between a bottom shrink trench and an upper trench portion above the top electrodes may result in the formation of defects or pockets during the Cu filling process. The embodiments of the present invention provide methods for forming the top electrode of a MTJ memory cell that reduces the resistance of the contact with the MTJ memory cell.

Various embodiments of the present disclosure allow for reducing the resistance caused by the bottom shrink trench and the top electrodes as illustrated with respect to FIG. 1. Various embodiments include devices and methods for performing a low selective etch to smooth the formation of cavities above top electrodes, such that the formation of a bottom shrink portion may be avoided. Various embodiments include devices and methods for performing a self-aligning and isotropic etch landing on an MTJ, such that TiN of a top electrode may be fully removed and replaced with lower resistance Cu, and that TiN of a mask layer may be fully removed.

FIG. 1 illustrates a vertical cross-sectional view of a typical MTJ structure after etching through exposed portions of first and second etch stop layers (172, 174) to expose top electrodes 158. The MTJ memory cell structure may include a memory array region 100 in which an array of memory elements are formed, and a logic region 200 in which logic devices that support operation of the array of memory elements are formed.

Referring to FIG. 1, in a typical process, first via cavities 179 may be vertically extended to expose a top electrode 158 of a MTJ memory cell by etching portions of a first etch stop layer 172. For example, an anisotropic etch process may be performed to remove portions of the first etch stop layer 172 using a mask layer 178. The mask layer 178 may be a via-level (i.e. used to form cavities for the formation of vias) etch mask layer. In one embodiment, the mask layer 178 may be a metallic etch mask layer. The chemistry of the anisotropic etch process may be selective to the materials of second spacer portions 164. For example, the first etch stop layer 172 may include silicon nitride, and the anisotropic etch process may include a reactive ion etch process that etches silicon nitride selective to the dielectric materials of the second spacer portions 164.

The first via cavities 179 vertically extend through first and second etch stop layers (172, 174) such that sidewalls of the first and second etch stop layers (172, 174) may be exposed around each first via cavity 179. Top surfaces of the top electrodes 158 may be exposed underneath the array of first via cavities 179. Each first via cavity 179 may comprise both an upper portion that is laterally surrounded by the upper connection-level dielectric layer 176, and a downward-protruding portion, or bottom shrink trench, that is laterally surrounded by the first and second etch stop layers (172, 174). The downward-protruding portion may have a lesser lateral dimension than the upper portion of each first via cavity 179.

A metallic fill material layer (not shown) may be used to fill the via cavities (179, 279) to form a contact with top electrodes 158 of the MTJ memory cell structure in a memory region 100 and underlying metal lines 648 and vias 642 in a logic region 200. The metallic fill material layer may be comprised of copper (Cu), and the mask layer 178 and the top electrodes 158 may be comprised of titanium nitride (TiN). The mask layer 178 and top electrodes 158 may remain within the MTJ structure after the deposition and formation of the contacts using the metallic fill material layer in each via cavities 179. Due to the shape of the via cavities 179 having a down-protruding portion (i.e. bottom shrink trench) that has a lesser lateral dimension than the upper portion of each first via cavity 179, the metallic fill material layer used to fill the via cavities 179 may take on the dimensions of both the upper portion and downward-protruding portion. As a consequence of the bottom shrink trench of the downward-protruding portion, the top electrode 158 contact has a high electrical resistance. In other words, the width of the resulting contact formed from the metallic fill material layer according to the dimensions of the bottom shrink trench causes the contact to have a bottom portion having a small lateral width that is in contact with the top electrodes 158, thus inducing a high resistance value and therefore restricting the total amount of current flow.

Figure 2:
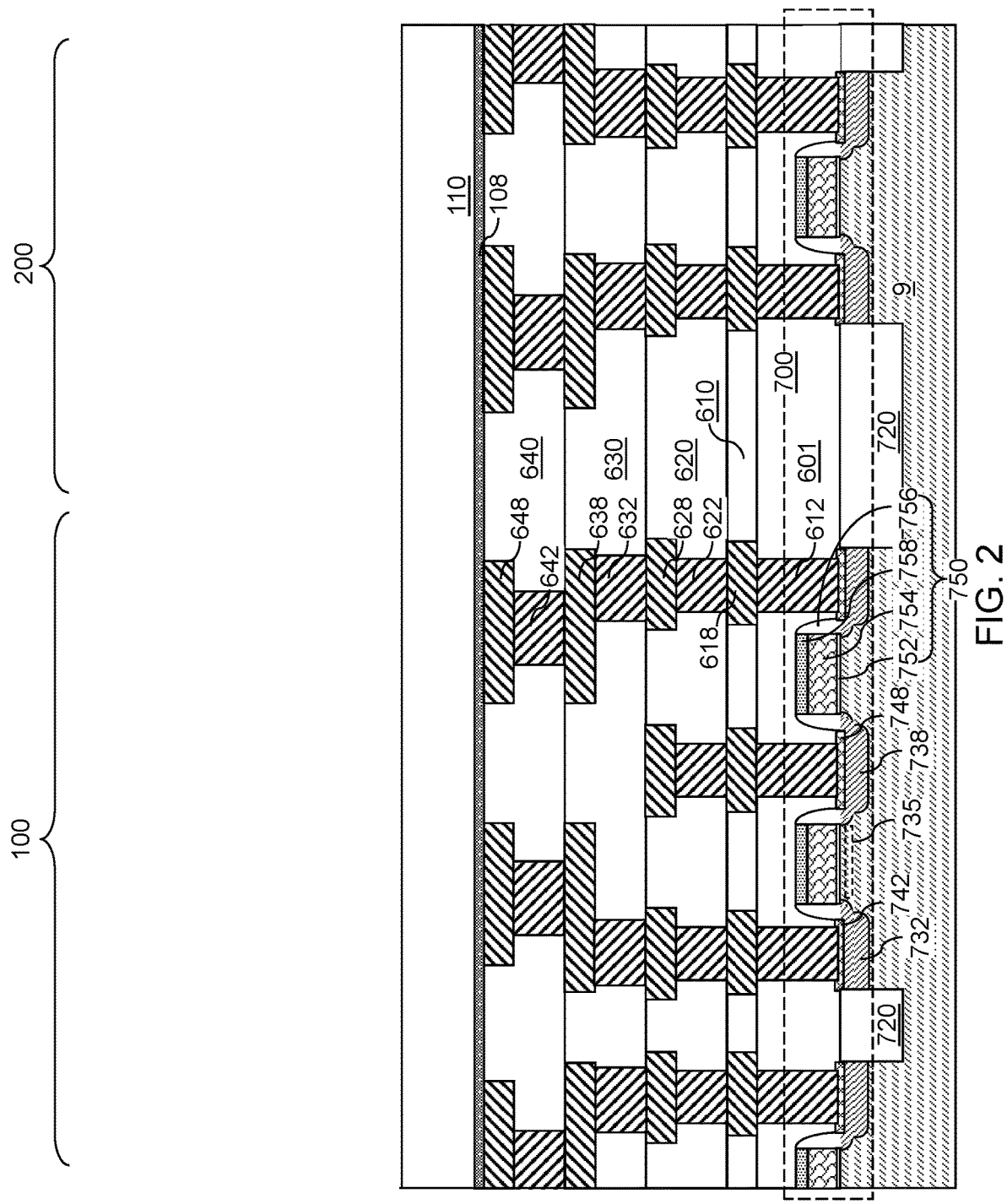
FIG. 2 is a vertical cross-sectional view of an exemplary structure after formation of complementary metal-oxide-semiconductor (CMOS) transistors and metal interconnect structures formed in interconnect-level dielectric layers according to an embodiment of the present disclosure.

Referring to FIG. 2, an exemplary structure according to an embodiment of the present disclosure is illustrated. FIG. 2 is a vertical cross-sectional view of an exemplary structure after formation of complementary metal-oxide-semiconductor (CMOS) transistors and metal interconnect structures formed in dielectric material layers according to an embodiment of the present disclosure. The exemplary structure includes a substrate 9, which may be a semiconductor substrate such as a commercially available silicon substrate. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of memory elements may be subsequently formed, and a logic region 200 in which logic devices that support operation of the array of memory elements may be formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the logic region 200 at this processing step. Devices (such as field effect transistors) in the logic region 200 may provide functions that are needed to operate the array of memory cells to be subsequently formed. Specifically, devices in the logic region may be configured to control the programming operation, the erase operation, and the sensing (read) operation of the array of memory cells. For example, the devices in the logic region may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures formed in dielectric material layers may be subsequently formed over the substrate 9 and the devices (such as field effect transistors). The dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first line structures 618 formed in the first interconnect-level dielectric material layer 610, first via structures 622 formed in a lower portion of the second interconnect-level dielectric material layer 620, second line structures 628 formed in an upper portion of the second interconnect-level dielectric material layer 620, second via structures 632 formed in a lower portion of the third interconnect-level dielectric material layer 630, third line structures 638 formed in an upper portion of the third interconnect-level dielectric material layer 630, third via structures 642 formed in a lower portion of the fourth interconnect-level dielectric material layer 640, and fourth line structures 648 formed in an upper portion of the fourth interconnect-level dielectric material layer 640. In one embodiment, the second line structures 628 may include source lines that are connected a source-side power supply for an array of memory elements. The voltage provided by the source lines may be applied to the bottom electrodes through the access transistors provided in the memory array region 100.

Each of the first and interconnect-level dielectric layers (601, 610, 620, 630, 640) may include a dielectric material such as undoped silicate glass, a doped silicate glass, organosilicate glass, amorphous fluorinated carbon, porous variants thereof, or combinations thereof. Each of the interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first via structures 622 and the second line structures 628 may be formed as integrated line and via structures by a dual damascene process, the second via structures 632 and the third line structures 638 may be formed as integrated line and via structures, and/or the third via structures 642 and the fourth line structures 648 may be formed as integrated line and via structures. While the present disclosure is described using an embodiment in which an array of memory cells formed over the fourth interconnect-level dielectric material layer 640, embodiments are expressly contemplated herein in which the array of memory cells may be formed at a different interconnect level.

A cap layer 108 and a lower connection-level dielectric layer 110 may be formed over the metal interconnect structures and the interconnect dielectric material layers. For example, the cap layer 108 may be formed on the top surfaces of the fourth line structures 648 and on the top surface of the fourth interconnect-level dielectric material layer 640. The cap layer 108 may include a dielectric capping material that may protect underlying metal interconnect structures such as the fourth line structures 648. In one embodiment, the cap layer 108 may include a material that may provide high etch resistance, i.e., a dielectric material, and also may function as an etch stop material during a subsequent anisotropic etch process that etches the first lower connection-level dielectric layer 110. For example, the cap layer 108 may include silicon carbide or silicon nitride, and may have a thickness in a range from 5 nm to 30 nm, although lesser and greater thicknesses may also be used.

The lower connection-level dielectric layer 110 may include any material that may be used for the first and interconnect-level dielectric layers (601, 610, 620, 630, 640). For example, the lower connection-level dielectric layer 110 may include undoped silicate glass or a doped silicate glass deposited by decomposition of tetraethylorthosilicate (TEOS). The thickness of the lower connection-level dielectric layer 110 may be in a range from 50 nm to 200 nm, although lesser and greater thicknesses may also be used. The cap layer 108 and the lower connection-level dielectric layer 110 may be formed as planar blanket (unpatterned) layers having a respective planar top surface and a respective planar bottom surface that extends throughout the memory array region 100 and the logic region 200.

Figure 3:
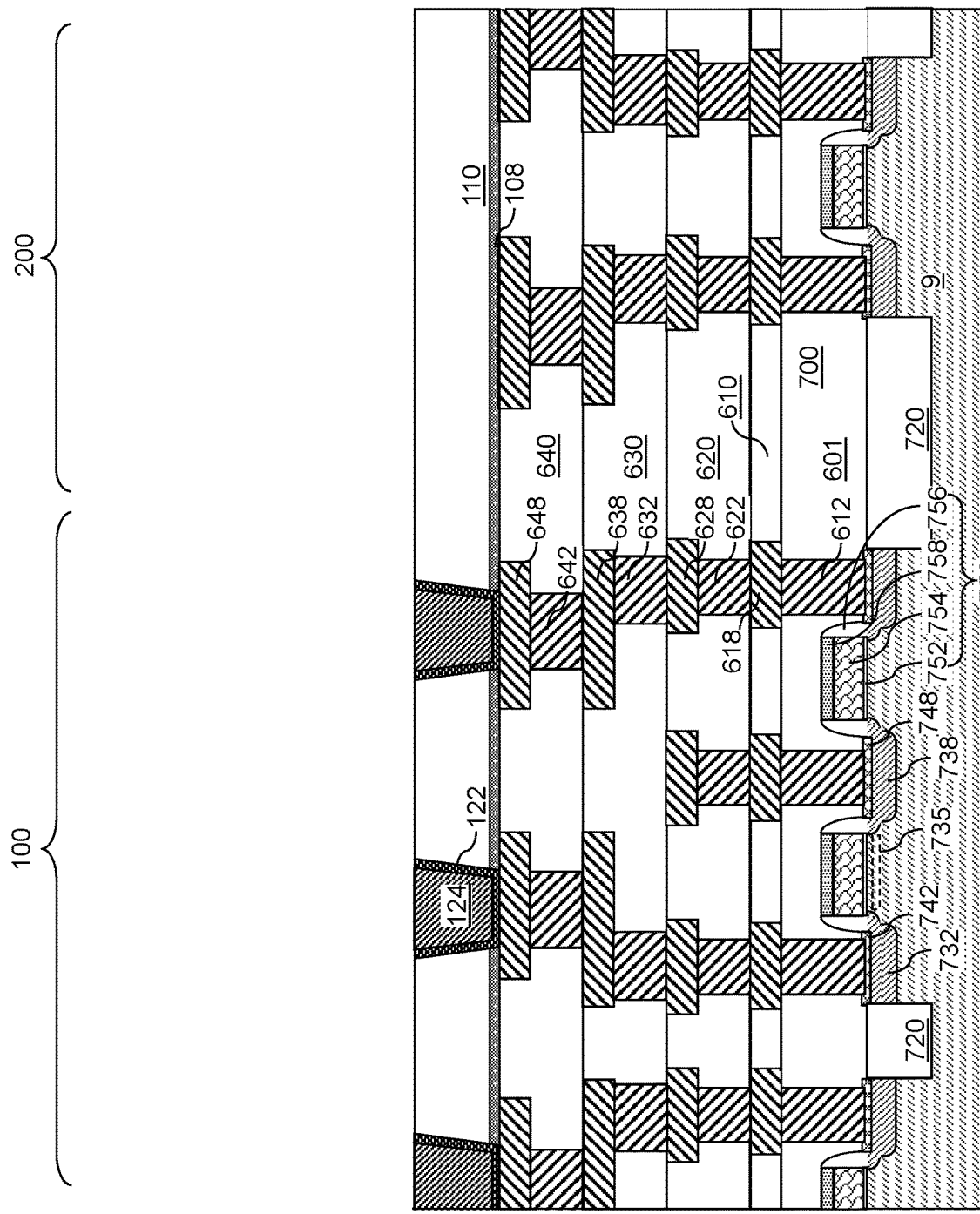
FIG. 3 is a vertical cross-sectional view of the exemplary structure after formation of an array of connection via structures according to an embodiment of the present disclosure.

FIG. 3 is a vertical cross-sectional view of the exemplary structure after formation of an array of connection via structures according to an embodiment of the present disclosure. Referring to FIG. 3, via cavities may be formed through the lower connection-level dielectric layer 110 and the cap layer 108. For example, a photoresist layer (not shown) may be applied over the lower connection-level dielectric layer 110 and may be patterned to form openings within areas of the memory array region 100 that overlie a respective one of the fourth line structures 648. An anisotropic etch may be performed to transfer the pattern in the photoresist layer through the through the lower connection-level dielectric layer 110 and the cap layer 108. The via cavities formed by the anisotropic etch process are herein referred to as lower-electrode-contact via cavities because bottom electrode connection via structures are subsequently formed in the lower-electrode-contact via cavities. The lower-electrode-contact via cavities may have tapered sidewalls having a taper angle (within respective to a vertical direction) in a range from 1 degree to 10 degrees. A top surface of a fourth line structure 648 may be exposed at the bottom of each lower-electrode-contact via cavity. The photoresist layer may be subsequently removed, for example, by ashing.

A metallic barrier layer may be formed as a material layer. The metallic barrier layer may cover exposed top surfaces of the fourth line structures 648, tapered sidewalls of the lower-electrode-contact via cavities, and the top surface of the lower connection-level dielectric layer 110 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as Tungsten (W), Cu, or tantalum nitride (TaN), may be deposited in remaining volumes of the lower-electrode-contact via cavities. Other suitable metallic fill materials to deposit within the lower-electrode-contact via cavities are within the contemplated scope of disclosure. Portions of the metallic fill material and the metallic barrier layer that overlie the horizontal plane including the topmost surface of the lower connection-level dielectric layer 110 may be removed by a planarization process such as chemical mechanical planarization to form. Each remaining portion of the metallic fill material located in a respective via cavity comprises a metallic via fill material portion 124. Each remaining portion of the metallic barrier layer in a respective via cavity comprises a metallic barrier layer 122. Each combination of a metallic barrier layer 122 and a metallic fill material portion 124 that fills a via cavity constitutes a connection via structure (122, 124). The connection via structure (122, 124) may be referred to as a bottom electrode via (BEVA). An array of connection via structures (122, 124) may be formed in the lower connection-level dielectric layer 110 on underlying metal interconnect structures.

Figure 4:
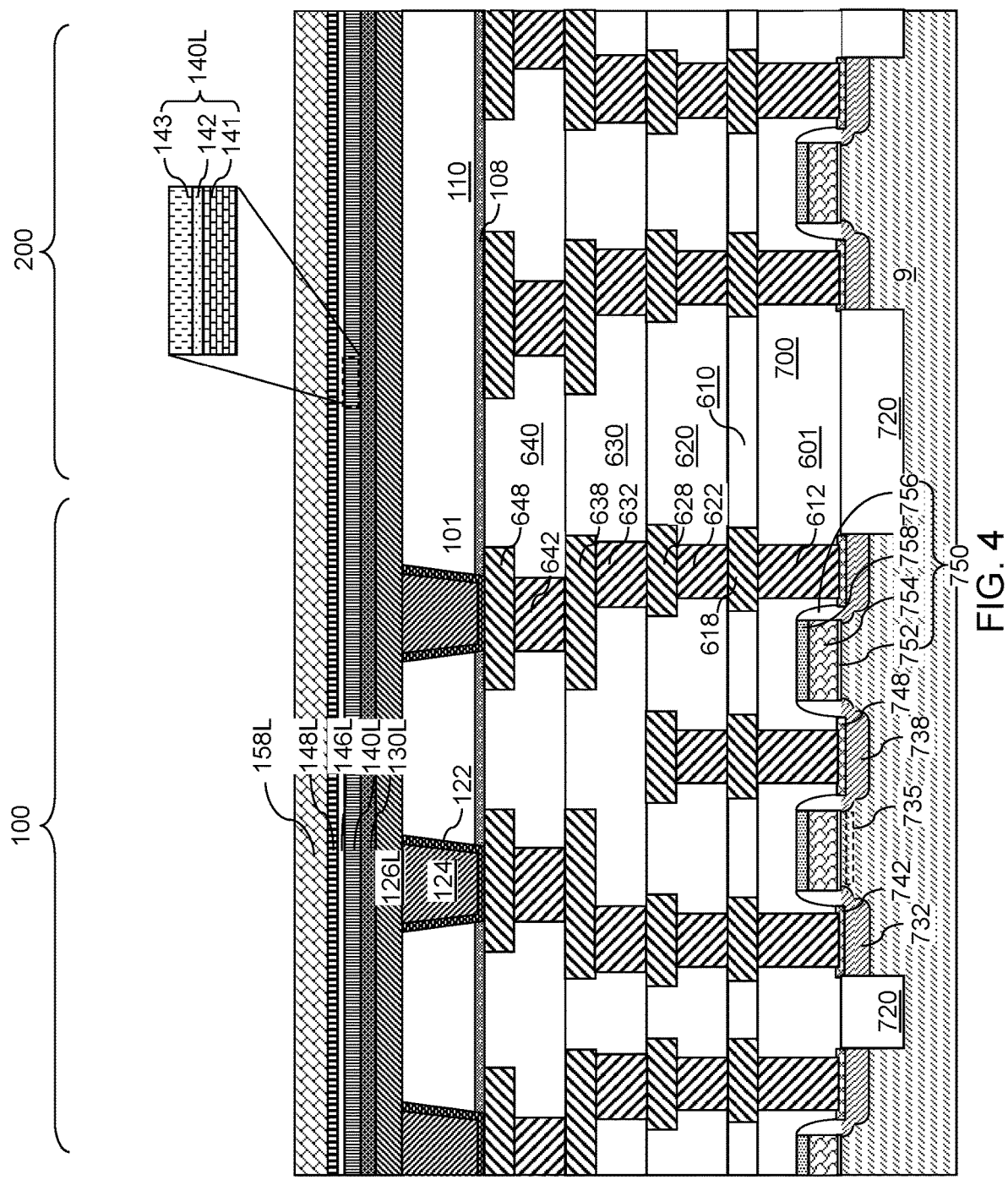
FIG. 4 is a vertical cross-sectional view of the exemplary structure after formation of a bottom electrode material layer, a nonmagnetic metallic buffer layer, a synthetic antiferromagnet layer, a nonmagnetic tunnel barrier layer, a free magnetization layer, and a top electrode material layer according to an embodiment of the present disclosure.

FIG. 4 is a vertical cross-sectional view of the exemplary structure after formation of a bottom electrode material layer, a nonmagnetic metallic buffer layer, a synthetic antiferromagnet layer, a nonmagnetic tunnel barrier layer, a free magnetization layer, and a top electrode material layer according to an embodiment of the present disclosure. Referring to FIG. 4, a layer stack including a bottom electrode material layer 126L, a nonmagnetic metallic buffer material layer 130L, a synthetic antiferromagnet layer 140L, a nonmagnetic tunnel barrier material layer 146L, a free magnetization material layer 148L, and a top electrode material layer 158L may be formed over the metallic barrier layer and the metallic via fill material portions 124. The layers within the layer stack may be deposited by a respective chemical vapor deposition process or a respective physical vapor deposition process. Each layer within the layer stack may be deposited as planar blanket material layers having a respective uniform thickness throughout. The nonmagnetic metallic buffer material layer 130L, the synthetic antiferromagnet layer 140L, the nonmagnetic tunnel barrier material layer 146L, and the free magnetization material layer 148L are collectively referred to as memory material layers. In other words, memory material layers are formed between the bottom electrode material layer 126L and the top electrode material layer 158L.

While the present disclosure is described using an embodiment in which the memory material layers include the nonmagnetic metallic buffer material layer 130L, the synthetic antiferromagnet layer 140L, the nonmagnetic tunnel barrier material layer 146L, and the free magnetization material layer 148L, the methods and structures of the present disclosure may be applied to any structure in which the memory material layers include a different layer stack provided between a bottom electrode material layer 126L and a top electrode material layer 158L and include material layers that may store information in any manner. Modifications of the present disclosure are expressly contemplated herein in which the memory material layers include a phase change memory material, a ferroelectric memory material, or a vacancy-modulated conductive oxide material.

The bottom electrode material layer 126L includes at least one nonmagnetic metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 126L may include, and/or may consist essentially of, an elemental metal such as W, Cu, Ti, Ta, Ru, Co, Mo, or Pt. The thickness of the bottom electrode material layer 126L may be in a range from 10 nm to 100 nm, although lesser and greater thicknesses may also be used.

The nonmagnetic metallic buffer material layer 130L includes a nonmagnetic material that may function as a seed layer. Specifically, the nonmagnetic metallic buffer material layer 130L may provide a template crystalline structure that aligns polycrystalline grains of the materials of the synthetic antiferromagnet layer 140L along directions that maximizes the magnetization of a reference layer within the synthetic antiferromagnet layer 140L. The nonmagnetic metallic buffer material layer 130L may include Ti, a CoFeB alloy, a NiFe alloy, ruthenium, or a combination thereof. The thickness of the nonmagnetic metallic buffer material layer 130L may be in a range from 3 nm to 30 nm, although lesser and greater thicknesses may also be used.

The synthetic antiferromagnet (SAF) layer 140L may include a layer stack of a ferromagnetic hard layer 141, an antiferromagnetic coupling layer 142, and a reference magnetization layer 143. Each of the ferromagnetic hard layer 141 and the reference magnetization layer 143 may have a respective fixed magnetization direction. The antiferromagnetic coupling layer 142 provides antiferromagnetic coupling between the magnetization of the ferromagnetic hard layer 141 and the magnetization of the reference magnetization layer 143 so that the magnetization direction of the ferromagnetic hard layer 141 and the magnetization direction of the reference magnetization layer 143 remain fixed during operation of the memory cells to be subsequently formed. The ferromagnetic hard layer 141 may include a hard ferromagnetic material such as PtMn, IrMn, RhMn, FeMn, OsMn, etc. The reference magnetization layer 143 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 142 may include ruthenium or iridium. The thickness of the antiferromagnetic coupling layer 142 may be selected such that the exchange interaction induced by the antiferromagnetic coupling layer 142 stabilizes the relative magnetization directions of the ferromagnetic hard layer 141 and the reference magnetization layer 143 at opposite directions, i.e., in an antiparallel alignment. In one embodiment, the net magnetization of the SAF layer 140L by matching the magnitude of the magnetization of the ferromagnetic hard layer 141 with the magnitude of the magnetization of the reference magnetization layer 143. The thickness of the SAF layer 140L may be in a range from 5 nm to 30 nm, although lesser and greater thicknesses may also be used.

The nonmagnetic tunnel barrier material layer 146L may include a tunneling barrier material, which may be an electrically insulating material having a thickness that allows electron tunneling. For example, the nonmagnetic tunnel barrier material layer 146L may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the nonmagnetic tunnel barrier material layer 146L may be 0.7 nm to 1.3 nm, although lesser and greater thicknesses may also be used.

The free magnetization material layer 148L includes a ferromagnetic material having two stable magnetization directions that are parallel or antiparallel to the magnetization direction of the reference magnetization layer 143. The free magnetization material layer 148L includes a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization material layer 148L may be in a range from 1 nm to 6 nm, although lesser and greater thicknesses may also be used.

The top electrode material layer 158L includes a top electrode material, which may include any nonmagnetic material that may be used for the bottom electrode material layer 126L. Exemplary metallic materials that may be used for the top electrode material layer 158L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 126L may include, and/or may consist essentially of, an elemental metal such as W, Cu, Ti, Ta, Ru, Co, Mo, or Pt. The thickness of the top electrode material layer 158L may be in a range from 10 nm to 100 nm, although lesser and greater thicknesses may also be used.

Figure 5:
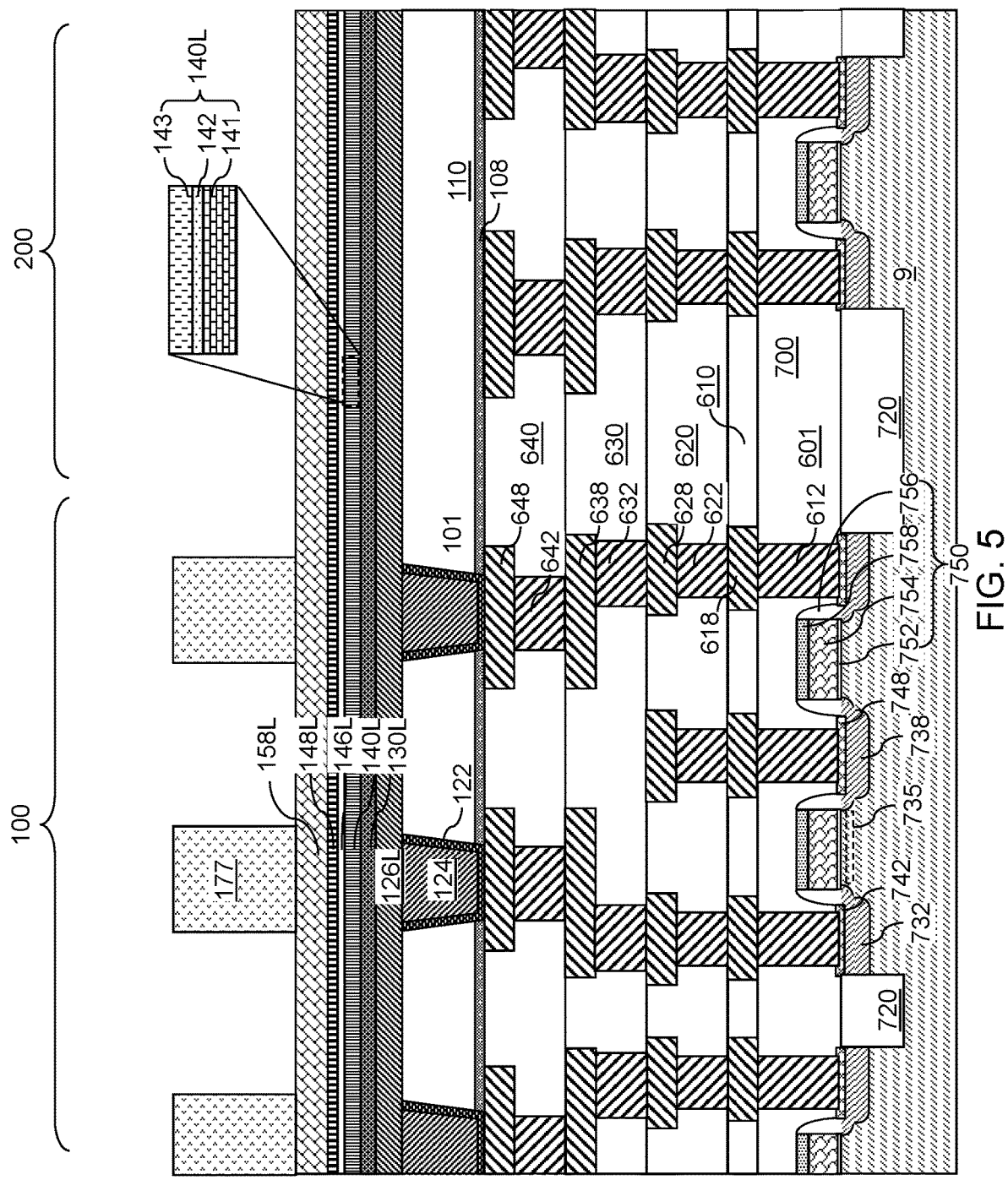
FIG. 5 is a vertical cross-sectional view of the exemplary structure after depositing and patterning a photoresist layer according to an embodiment of the present disclosure.

FIG. 5 is a vertical cross-sectional view of the exemplary structure after depositing and patterning a photoresist layer according to an embodiment of the present disclosure. Referring to FIG. 5, a photoresist layer 177 may be applied over the top electrode material layer 158L, and may be lithographically patterned to form an array of discrete photoresist material portions. Each discrete photoresist material portion in the array of discrete photoresist material portions may overlie a respective one of the connection via structures (122, 124). In one embodiment, the connection via structures (122, 124) may be arranged as a two-dimensional periodic array having a first pitch along a first horizontal direction and a second pitch along a second horizontal direction. The discrete photoresist material portions may be arranged as a two-dimensional periodic array having the same periodicity as the two-dimensional periodic array of the connection via structures (122, 124).

Figure 6:
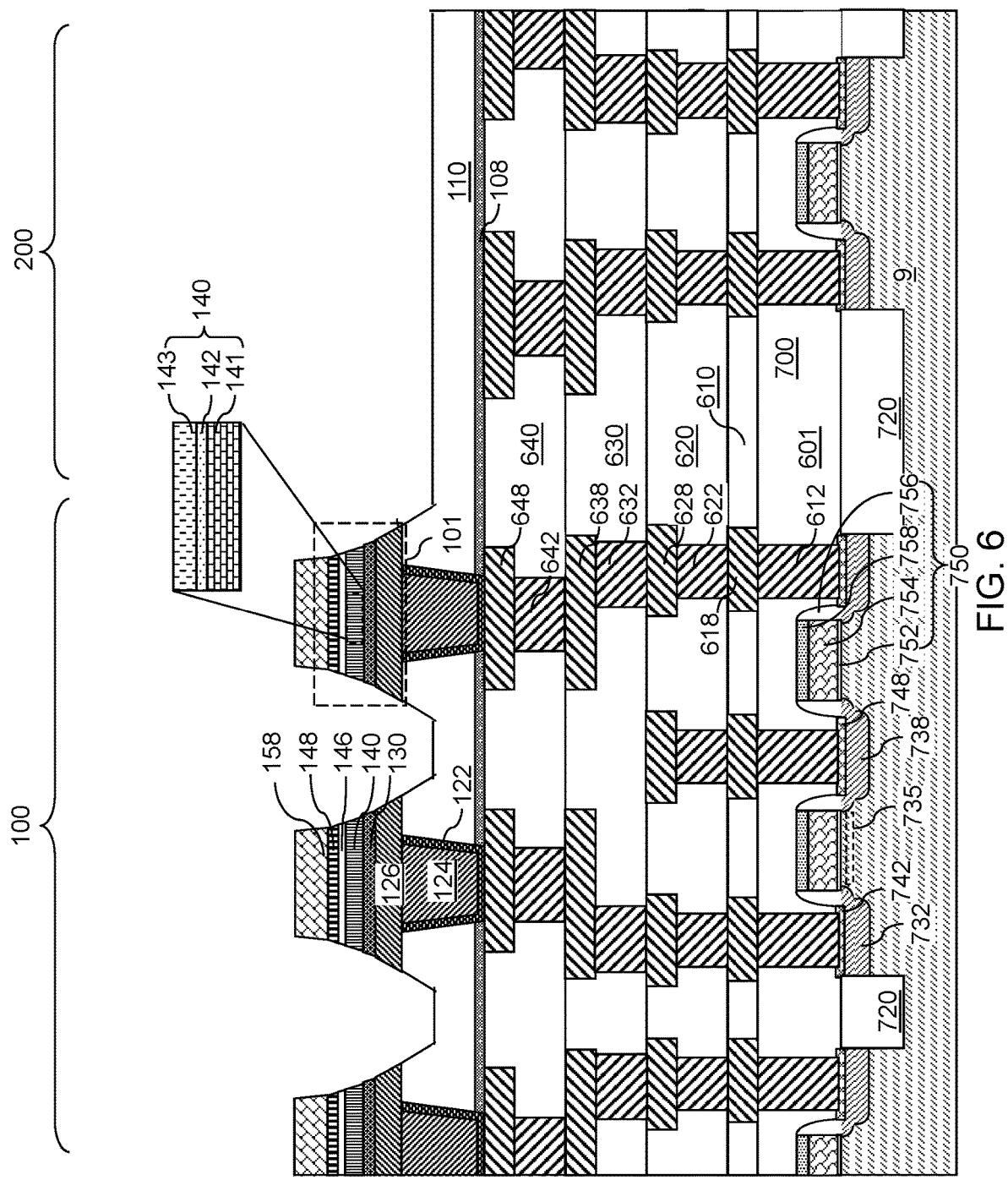
FIG. 6 is a vertical cross-sectional view of the exemplary structure after formation of an array of memory cells according to an embodiment of the present disclosure.

FIG. 6 is a vertical cross-sectional view of the exemplary structure after formation of an array of memory cells according to an embodiment of the present disclosure. Referring to FIG. 6, an anisotropic etch process may be performed to transfer the pattern of the photoresist layer 177 through the layer stack including the top electrode material layer 158L, the free magnetization material layer 148L, the nonmagnetic tunnel barrier material layer 146L, the synthetic antiferromagnet layer 140L, the nonmagnetic metallic buffer material layer 130L, and the bottom electrode material layer 126L. Portions of the layer stack (158L, 148L, 146L, 140L, 130L, 126L) that are not masked by the photoresist layer 177 are etched during the anisotropic etch process.

The anisotropic etch process may include a series of anisotropic etch steps that sequentially etches the various material layers of the underlying layer stack. In one embodiment, patterned portions of the layer stack may include sidewalls having a non-zero taper angle, i.e., having a non-vertical surface. The taper angle may vary from layer to layer, and generally may be in a range from 3 degrees to 30 degrees, such as from 6 degrees to 20 degrees, although lesser and greater taper angles may also be used. Unmasked portions of the lower connection-level dielectric layer 110 may be vertically recessed by the second anisotropic etch process.

The layer stack (158L, 148L, 146L, 140L, 130L, 126L) of the top electrode material layer 158L, the free magnetization material layer 148L, the nonmagnetic tunnel barrier material layer 146L, the synthetic antiferromagnet layer 140L, the nonmagnetic metallic buffer material layer 130L, and the bottom electrode material layer 126L may be patterned into an array of memory cells (126, 130, 140, 146, 158). Each of the memory cells (126, 130, 140, 146, 158) comprises a bottom electrode 126, a memory material stack (130, 140, 146, 148), and a top electrode 158. For purposes of this disclosure, the top electrode material layer 158L may be referred to as a barrier layer (e.g., second barrier material layer), and the top electrodes 158 may be referred to as barriers, which, in some embodiments, may be removed during various etching processes.

In one embodiment, each memory cell (126, 130, 140, 146, 148, 158) may be an MTJ memory cell. Each MTJ memory cell (126, 130, 140, 146, 148, 158) may include a bottom electrode 126, a magnetic tunnel junction structure (140, 146, 148), and a top electrode 158. Each magnetic tunnel junction (140, 146, 148) may include a synthetic antiferromagnet (SAF) structure 140, a nonmagnetic tunnel barrier layer 146, and a free magnetization layer 148. A nonmagnetic metallic buffer layer 130 may be provided between the bottom electrode 126 and the magnetic tunnel junction (140, 146, 148). Each bottom electrode 126 is a patterned portion of the bottom electrode material layer 126L. Each SAF structure 140 is a patterned portion of the SAF layer 140L. Each nonmagnetic tunnel barrier layer 146 is a patterned portion of the nonmagnetic tunnel barrier material layer 146L. Each free magnetization layer 148 is a patterned portion of the free magnetization material layer 148L. Each top electrode 158 is a patterned portion of the photoresist layer 177. In one embodiment, each of the memory cells (126, 130, 140, 146, 148, 158) comprises a vertical stack including a synthetic antiferromagnet structure 140, a nonmagnetic tunnel barrier layer 146, and a free magnetization layer 148.

Figure 7:
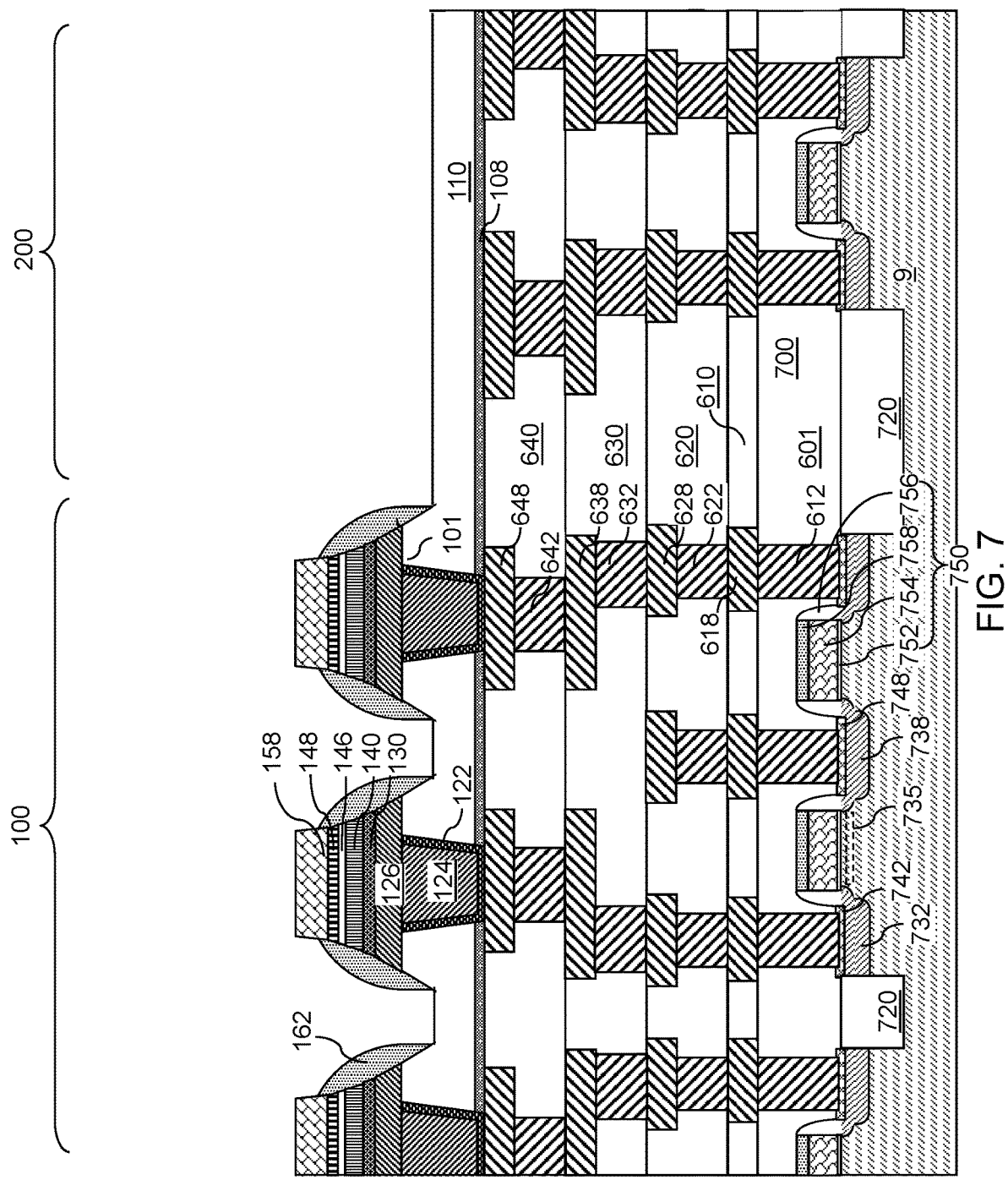
FIG. 7 is a vertical cross-sectional view of the exemplary structure after formation of an array of first dielectric spacer portions according to an embodiment of the present disclosure.

FIG. 7 is a vertical cross-sectional view of the exemplary structure after formation of an array of first spacer portions (e.g., inner dielectrics spacers) according to an embodiment of the present disclosure. Referring to FIG. 7, a first dielectric material such as silicon nitride may be conformally deposited over the array of memory cells (126, 130, 140, 146, 148, 158). For example, the first dielectric material may be deposited by a chemical vapor deposition process. The thickness of the first dielectric material over a horizontal surface may be in a range from 2 nm to 20 nm, such as from 4 nm to 10 nm, although lesser and greater thicknesses may also be used. An anisotropic etch process may be performed to remove horizontal portions of the first dielectric material. Remaining portions of the first dielectric material comprise an array of first spacer portions 162 that laterally surrounds the array of memory cells (126, 130, 140, 146, 148, 158). In one embodiment, the duration of the anisotropic etch process may be selected such that sidewalls of the array of the top electrodes 158 are partly or fully exposed. The maximum thickness of each first spacer portion 162 may be in a range from 2 nm to 20 nm, such as from 4 nm to 10 nm, although lesser and greater thicknesses may also be used.

Figure 8:
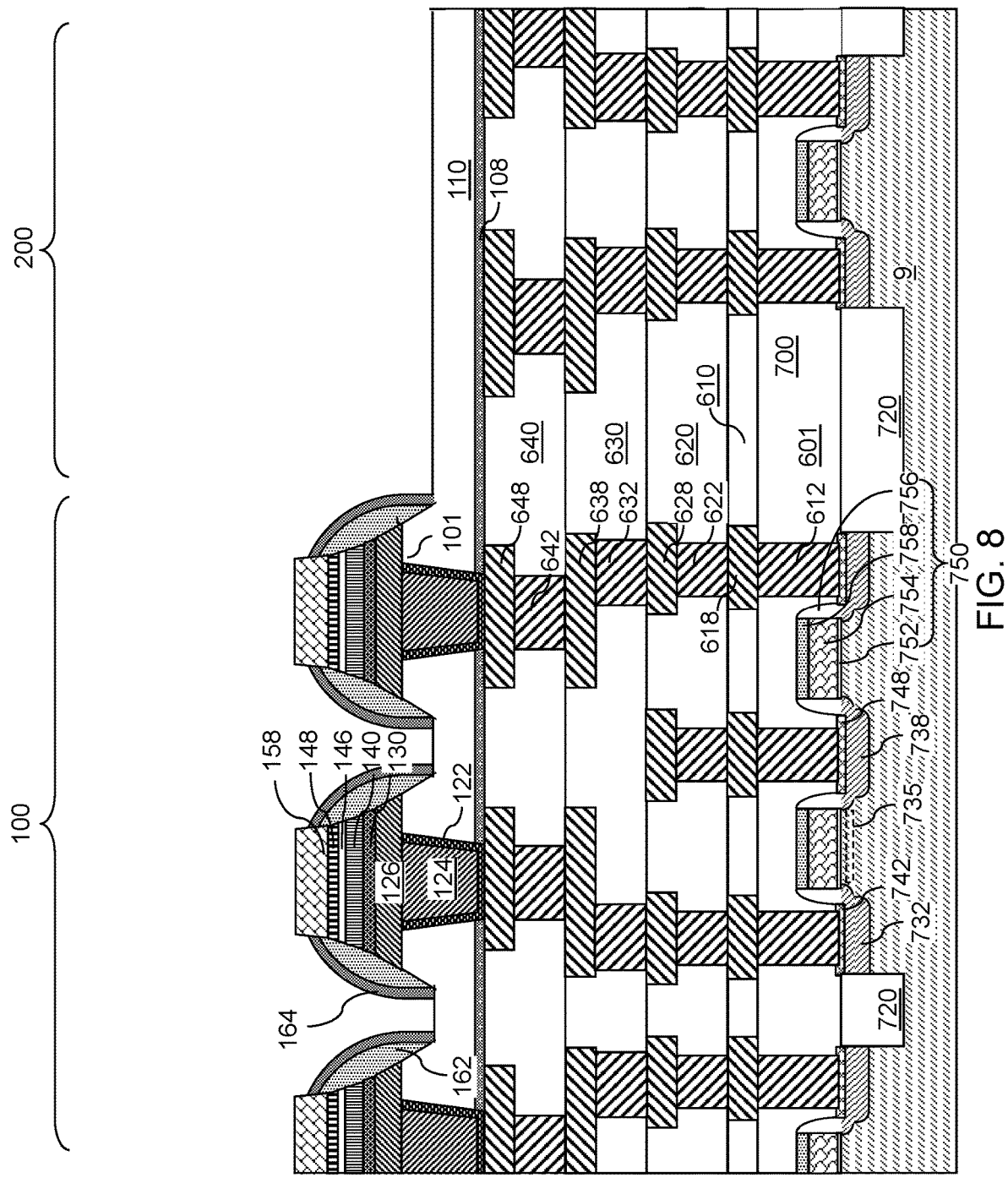
FIG. 8 is a vertical cross-sectional view of the exemplary structure after formation of an array of second dielectric spacer portions according to an embodiment of the present disclosure.

FIG. 8 is a vertical cross-sectional view of the exemplary structure after formation of an array of second spacer portions (e.g., outer dielectric spacers) according to an embodiment of the present disclosure. Referring to FIG. 8, a second dielectric material such as a dielectric metal oxide may be conformally deposited over the array of first spacer portions 162. For example, the second dielectric material may include aluminum oxide (AlOx), aluminum nitride (AlN), hafnium oxide, lanthanum oxide, or yttrium oxide, and may be deposited by a chemical vapor deposition process. The thickness of the second dielectric material over a horizontal surface may be in a range from 2 nm to 20 nm, such as from 4 nm to 10 nm, although lesser and greater thicknesses may also be used. An anisotropic etch process may be performed to remove horizontal portions of the second dielectric material. Remaining portions of the second dielectric material comprise an array of second spacer portions 164 that laterally surrounds the array of first spacer portions 162. In one embodiment, the second spacer portions 164 may be deposited directly on sidewalls of the top electrode 158. In one embodiment, the entirety of each sidewall of the top electrodes 158 may contact a respective second spacer portion 164. The maximum thickness of each second spacer portion 164 may be in a range from 2 nm to 20 nm, such as from 4 nm to 10 nm, although lesser and greater thicknesses may also be used.

Each combination of a first spacer portion 162 and a second spacer portion 164 constitutes a spacer (162, 164). An array of spacers (162, 164) laterally surrounds the array of memory cells (126, 130, 140, 146, 148, 158). While the present disclosure is described using an embodiment in which a spacer (162, 164) includes a first spacer portion 162 and a second spacer portion 164, embodiments are expressly contemplated herein in which a dielectric spacer consists of a first spacer portion 162 or consists of a second spacer portion 164. Generally, a spacer (162, 164) may be formed around each top electrode 158 within the array of top electrodes 158. Each spacer (162, 164) may be formed directly on, and around, a sidewall of a respective top electrode 158 portion.

Figure 9:
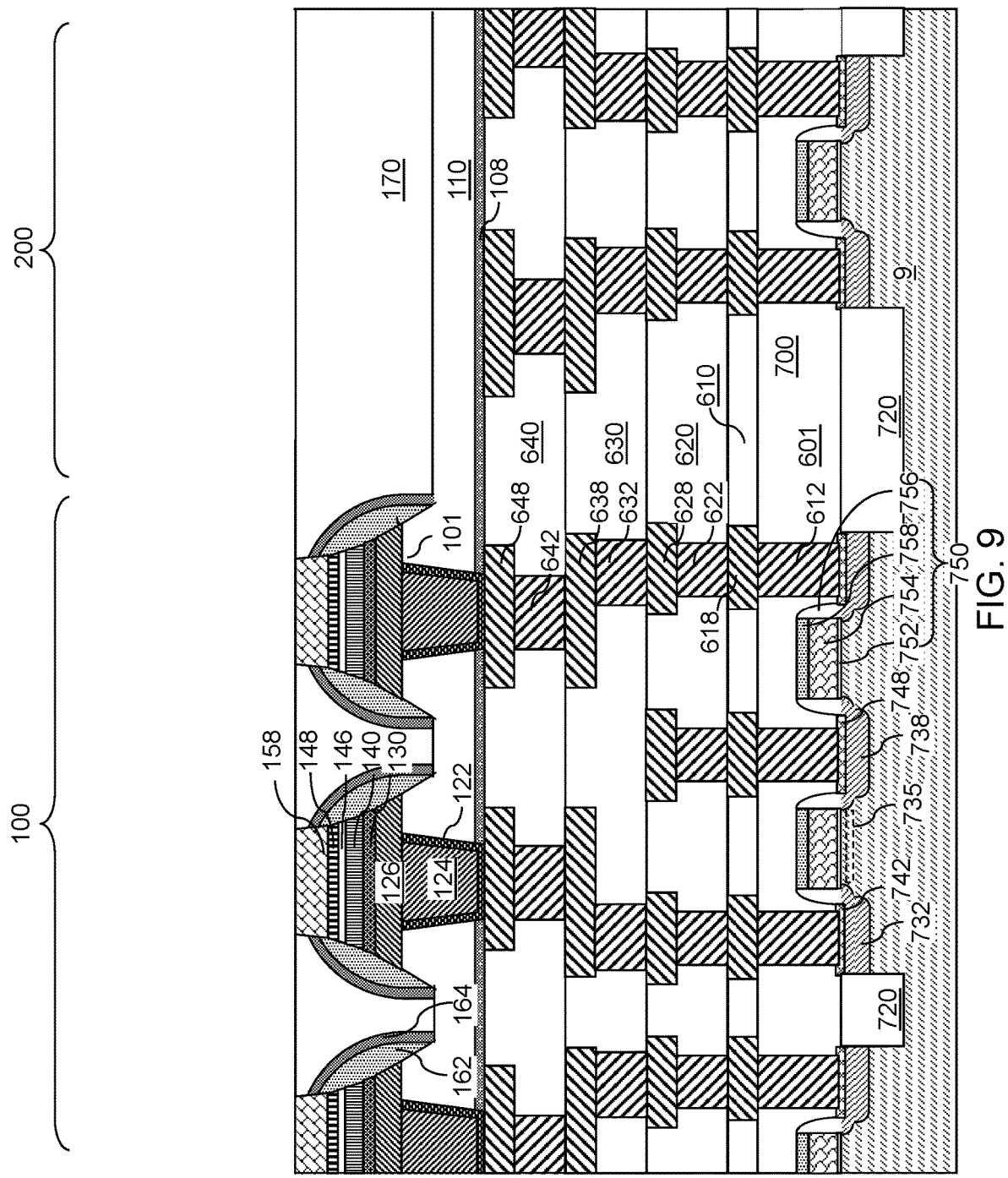
FIG. 9 is a vertical cross-sectional view of the exemplary structure after formation of a memory-level dielectric layer according to an embodiment of the present disclosure.

FIG. 9 is a vertical cross-sectional view of the exemplary structure after formation of a dielectric layer according to an embodiment of the present disclosure. Referring to FIG. 9, a memory-level dielectric layer 170 may be formed around the array of spacers (162, 164) within the memory array region 100 and above the lower connection-level dielectric layer 110 within the logic region 200. The memory-level dielectric layer 170 includes a planarizable dielectric material such as undoped silicate glass or a doped silicate glass. The dielectric material of the memory-level dielectric layer 170 may be deposited by a conformal deposition process (such as a chemical vapor deposition process) or a self-planarizing deposition process (such as spin coating). A chemical mechanical planarization process may be performed to remove portions of the deposited dielectric material from above the horizontal plane including the top surfaces of the top electrodes 158. Various planarization assist structures (not shown) such as electrically isolated patterned portions of the top electrode layer 158L and underlying material layers may be used in the logic region 200 to assist planarization of the deposited dialuric material. Remaining portions of the deposited dielectric material after the planarization process constitute the memory-level dielectric layer 170. The top surface of the memory-level dielectric layer 170 may be within the same horizontal plane as the top surfaces of the top electrodes 158. In one embodiment, top surfaces of the spacers (162, 164), such as the top surfaces of the second spacer portions 164, may be within the same horizontal plane as the top surface of the memory-level dielectric layer 170. For example, the top surfaces of the spacers (162, 164) may fully surround the top electrodes 158 such that the top electrodes 158 are not in contact with the memory-level dielectric layer 170.

Figure 10:
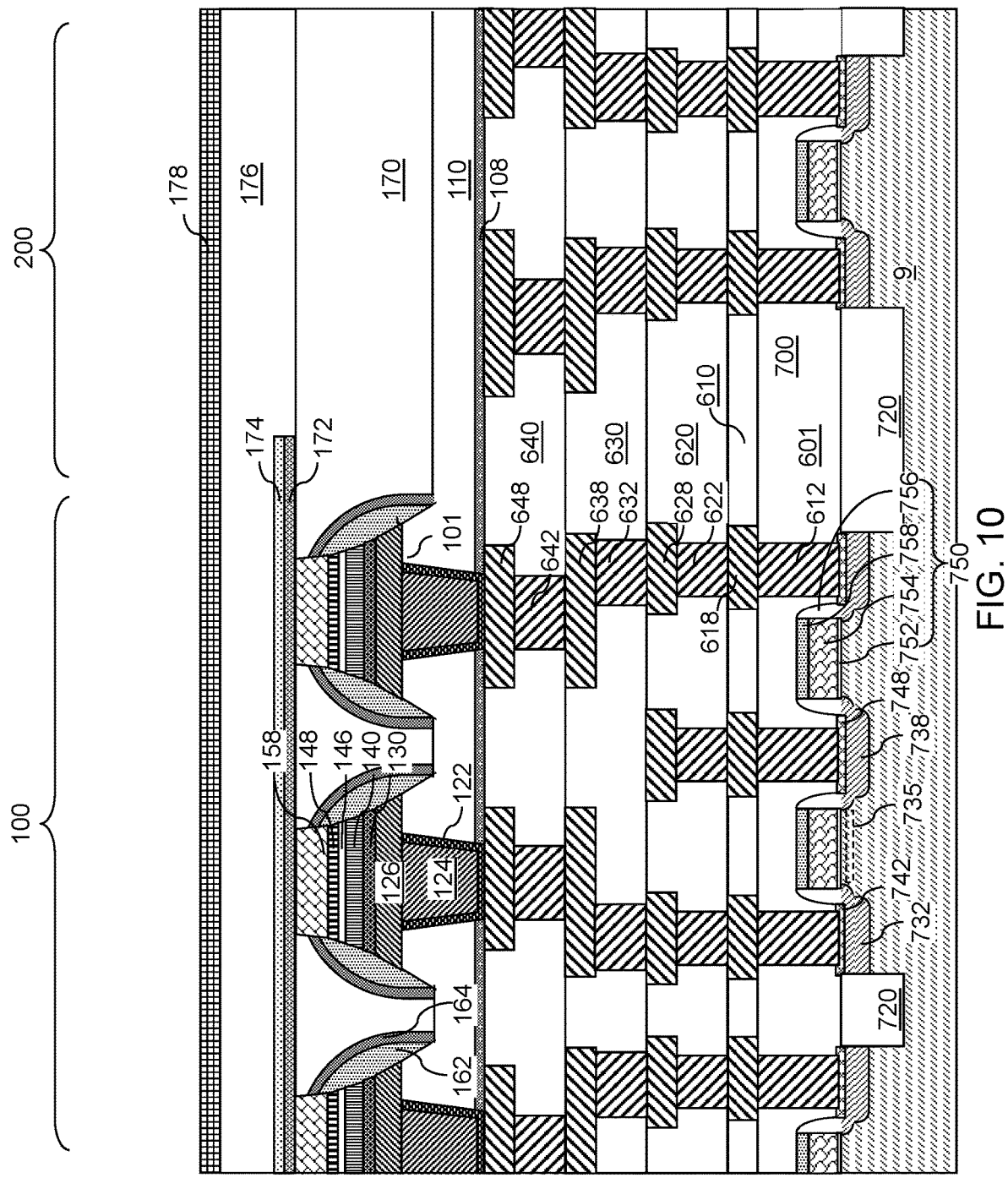
FIG. 10 is a vertical cross-sectional view of the exemplary structure after formation of a first and second etch stop layers and a upper connection-level dielectric layer according to an embodiment of the present disclosure.

FIG. 10 is a vertical cross-sectional view of the exemplary structure after formation of first and second etch stop layers and a upper connection-level dielectric layer according to an embodiment of the present disclosure. Referring to FIG. 10, a first etch stop layer 172 and a second etch stop layer 174 may be sequentially deposited over the memory-level dielectric layer 170 and top surface of the top electrodes 158. The first etch stop layer 172 may include a dielectric material that is different from the dielectric material of the memory-level dielectric layer 170. In one embodiment, the memory-level dielectric layer 170 may include a silicon oxide-based dielectric material such as undoped silicate glass or a doped silicate glass, and the first etch stop layer 172 may include a silicon-containing dielectric material such as silicon nitride, silicon oxynitride, silicon carbide, silicon carbon nitride, or silicon carbide nitride. The first etch stop layer 172 may be deposited by a conformal or non-conformal deposition process. In one embodiment, the first etch stop layer 172 may be formed by chemical vapor deposition, atomic layer deposition, or physical vapor deposition. The thickness of the first etch stop layer 172 may be in a range from 2 nm to 20 nm, such as from 3 nm to 12 nm, although lesser and greater thicknesses may also be used.

The second etch stop layer 174 includes a dielectric material that is different from the dielectric material of the first etch stop layer 172. In one embodiment, the second etch stop layer 174 may include a dielectric metal oxide material such as aluminum oxide aluminum nitride, hafnium oxide, titanium oxide, tantalum oxide, yttrium oxide, and/or lanthanum oxide. Other suitable etch stop layer materials are within the contemplated scope of disclosure. The second etch stop layer 174 may be deposited by a conformal or non-conformal deposition process. In one embodiment, the second etch stop layer 174 may be formed by chemical vapor deposition, atomic layer deposition, or physical vapor deposition. The thickness of the second etch stop layer 174 may be in a range from 2 nm to 20 nm, such as from 3 nm to 12 nm, although lesser and greater thicknesses may also be used.

The first etch stop layer 172 and the second etch stop layer 174 may be subsequently patterned so that the first etch stop layer 172 and the second etch stop layer 174 remain in the memory array region 100, and are removed from the logic region 200. For example, a photoresist layer (not shown) may be applied over the second etch stop layer 174, and may be lithographically patterned to cover the memory array region 100 without covering the logic region 200. Etch processes (such as wet etch processes) may be performed to etch unmasked portions of the first etch stop layer 172 and the second etch stop layer 174. The photoresist layer may be subsequently removed, for example, by ashing.

An upper connection-level dielectric layer 176 may be formed above the first and second etch stop layers (172, 174). The upper connection-level dielectric layer 176 includes a dielectric material such as undoped silicate glass, a doped silicate glass, or organosilicate glass. The dielectric material of the upper connection-level dielectric layer 176 may be deposited by a conformal deposition process (such as a chemical vapor deposition process) or a self-planarizing deposition process (such as spin coating). The thickness of the upper connection-level dielectric layer 176 in the memory array region 100 may be in a range from 50 nm to 300 nm, such as from 80 nm to 200 nm, although lesser and greater thicknesses may also be used.

A mask layer 178 may be formed over the upper connection-level dielectric layer 176. The mask layer 178 includes a metallic material that may function as an etch mask in subsequent anisotropic etch processes. For example, the mask layer 178 may include a conductive metallic nitride material (such as TiN, TaN, W, or WN) or a conductive metallic carbide material (such as TiC, TaC, or WC). In one embodiment, the mask layer 178 includes the same material as the top electrodes 158. In one embodiment, the mask layer 178 and the top electrodes 158 comprise, and/or consist essentially of, titanium nitride. The mask layer 178 may be formed by chemical vapor deposition or physical vapor deposition. The mask layer 178 may have a thickness in a range from 2 nm to 20 nm, such as from 3 nm to 10 nm, although lesser and greater thicknesses may also be used.

Figure 11:
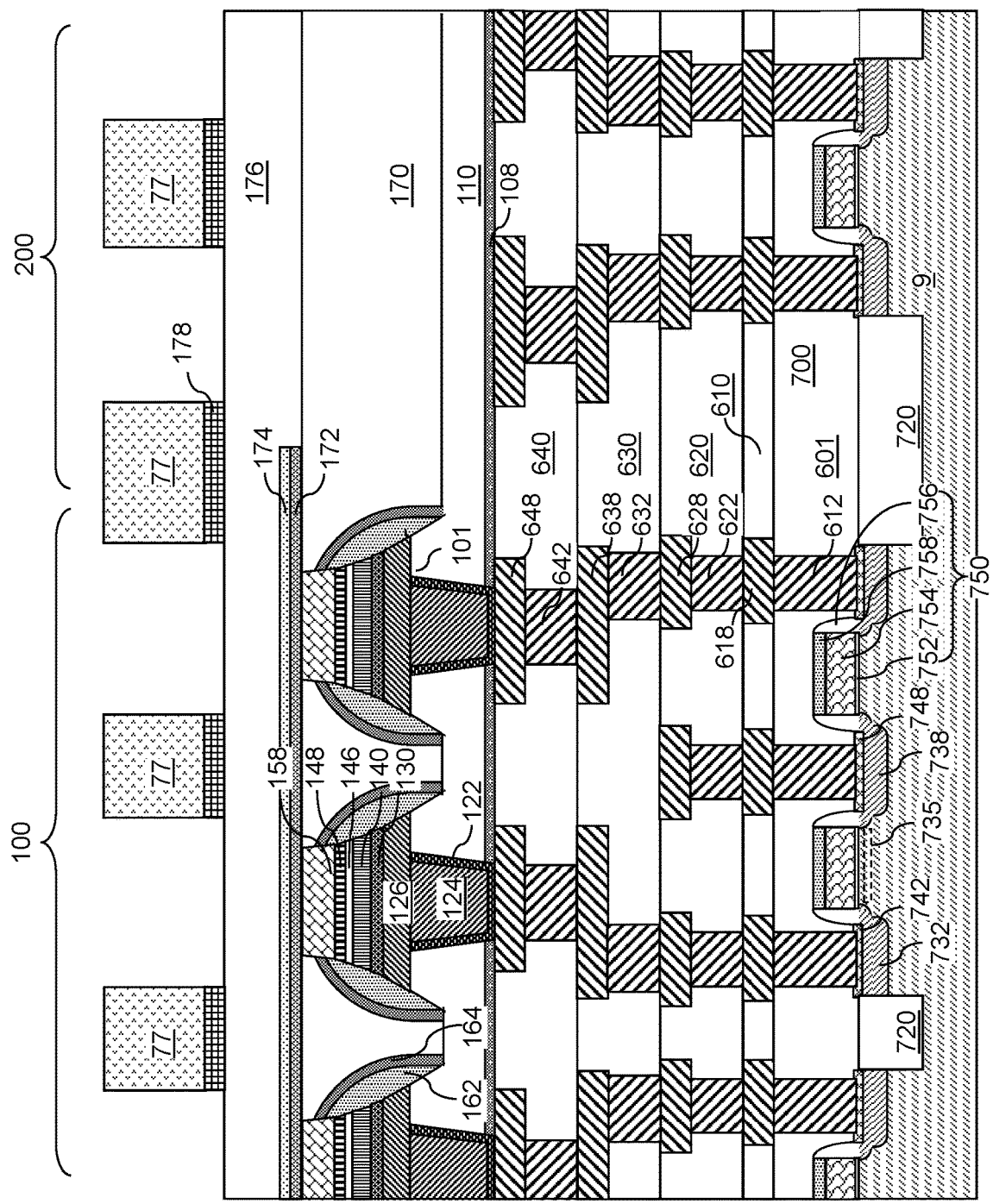
FIG. 11 is a vertical cross-sectional view of the exemplary structure after deposition and patterning of a mask layer according to an embodiment of the present disclosure.

FIG. 11 is a vertical cross-sectional view of the exemplary structure after deposition and patterning of a mask layer according to an embodiment of the present disclosure. Referring to FIG. 11, a photoresist layer 77 may be applied over the mask layer 178, and may be lithographically patterned to form an array of openings in areas that overlie the array of top electrodes 158. The area of each opening in the photoresist layer 77 may be greater than, less than, or the same as, the area of an underlying top electrodes 158. The periphery of each opening in the photoresist layer 77 may be located outside the sidewall of an underlying top electrode 158, may be located inside the sidewall of an underlying top electrode 158, or may coincide with the sidewall of an underlying top electrode 158 in a plan view, i.e., a view along a vertical direction. Additional openings may be formed in the photoresist layer 77 within the logic region 200. The areas of the openings in the photoresist layer 77 in the logic region 200 may overlie the areas of the underlying metal interconnect structures such as the fourth line structures 648.

An etch process may be performed to transfer the pattern in the photoresist layer 77 through the a mask layer 178. The etch process may include an anisotropic etch process or an isotropic etch process. In one embodiment, an anisotropic etch process such as a reactive ion etch process may be performed to transfer the pattern in the photoresist layer 77 through the mask layer 178. The photoresist layer 77 may be subsequently removed, for example, by ashing.

Figure 12:
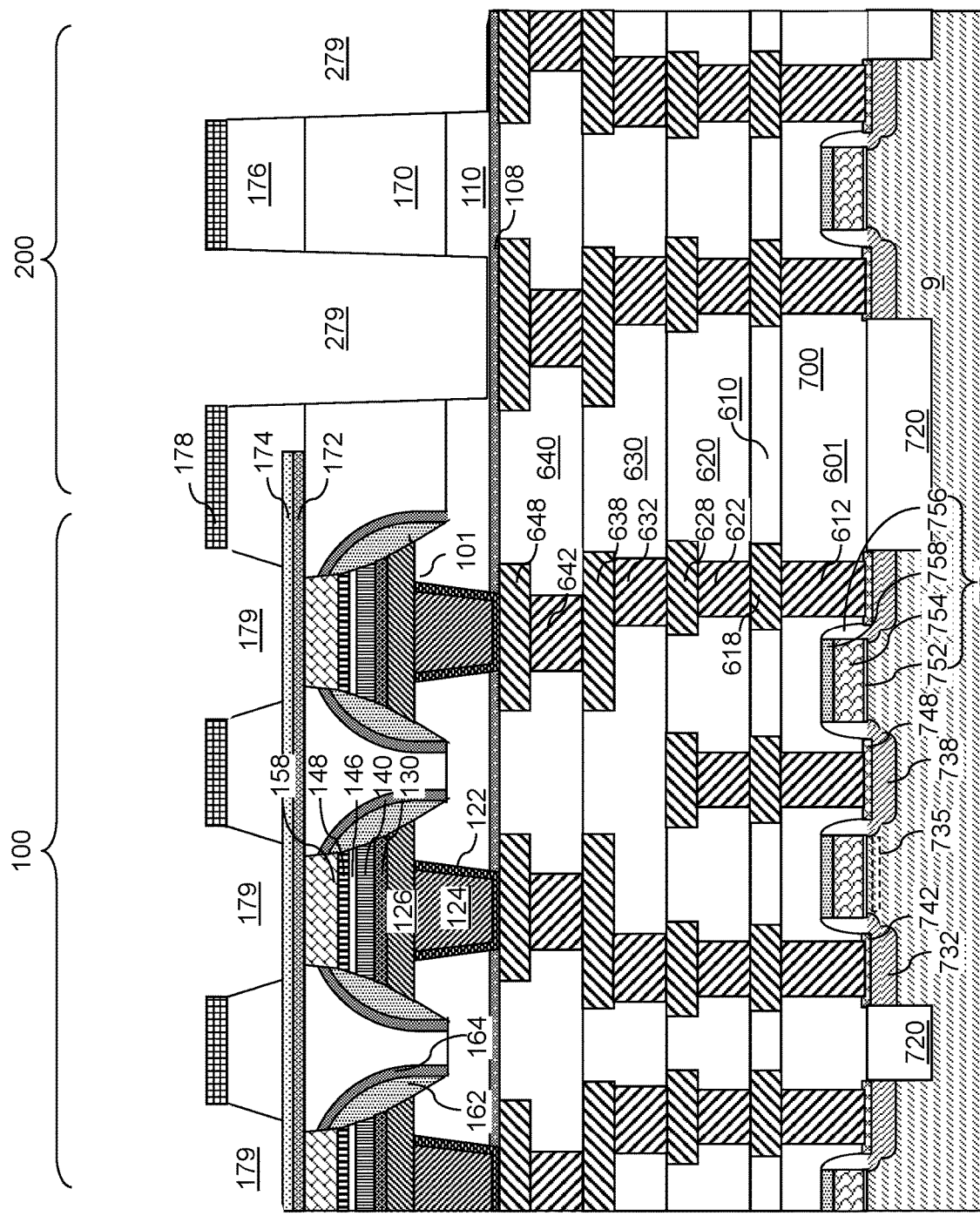
FIG. 12 is a vertical cross-sectional view of the exemplary structure after formation of an array of via cavities according to an embodiment of the present disclosure.

FIG. 12 is a vertical cross-sectional view of the exemplary structure after formation of an array of via cavities according to an embodiment of the present disclosure. Referring to FIG. 12, a first anisotropic etch process may be performed using the mask layer 178 as an etch mask. The first anisotropic etch process may comprise a reactive ion etch process that etches the upper connection-level dielectric layer 176, the memory-level dielectric layer 170, and the lower connection-level dielectric layer 110 selective to the materials of the second etch stop layer 174 and the cap layer 108. In one embodiment, the upper connection-level dielectric layer 176, the memory-level dielectric layer 170, and the lower connection-level dielectric layer 110 may include silicon oxide-based dielectric materials such as undoped silicate glass, a doped silicate glass, or organosilicate glass, and the first anisotropic etch process may include a reactive ion etch process that etches the silicon oxide-based dielectric material selective to the dielectric materials of the second etch stop layer 174 and the cap layer 108.

Via cavities (179, 279) may be formed underneath the opening through the mask layer 178. Specifically, first via cavities 179 vertically extending through the upper connection-level dielectric layer 176 may be formed in the memory array region 100. A top surface of the second etch stop layer 174 may be exposed at the bottom of each first via cavity 179. An array of first via cavities 179 may be formed over the array of memory cells (126, 130, 140, 146, 148, 158). Second via cavities 279 vertically extending through the upper connection-level dielectric layer 176, the memory-level dielectric layer 170, and the lower connection-level dielectric layer 110 may be formed in the logic region 200. A top surface of the cap layer 108 may be exposed at the bottom of each second via cavity 279.

In one embodiment, each first via cavity 179 as formed through the upper connection-level dielectric layer 176 may have a greater lateral extent than the lateral extent of each top electrode 158. In one embodiment, each top electrode 158 may have a circular horizontal cross-sectional shape, an elliptical horizontal cross-sectional shape, a rectangular horizontal cross-sectional shape, or a horizontal cross-sectional shape of a rounded rectangle. In this embodiment, each first via cavity 179 may have a horizontal cross-sectional shape that is a magnification of the horizontal cross-sectional shape of one of the top electrodes 158. In an illustrative example, the maximum lateral dimension of each first via cavity 179 may be in a range from 100.1% to 150% of the maximum lateral dimension of one of the top electrodes 158.

Figure 13:
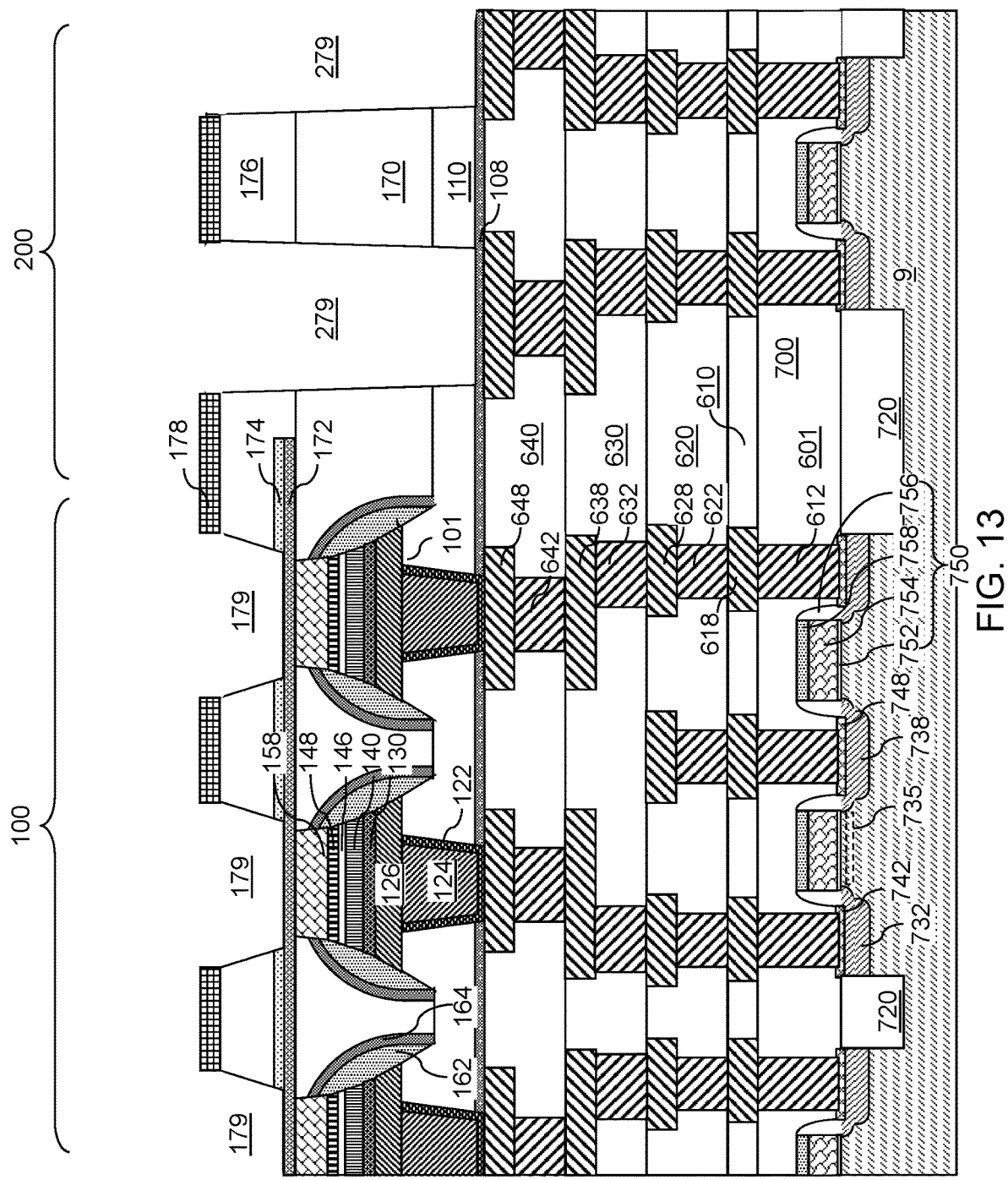
FIG. 13 is a vertical cross-sectional view of the exemplary structure after etching through exposed portions of a second etch stop layer according to an embodiment of the present disclosure.

FIG. 13 is a vertical cross-sectional view of the exemplary structure after etching through exposed portions of a second etch stop layer according to an embodiment of the present disclosure. Referring to FIG. 13, the first via cavities 179 may be vertically extended by etching exposed portions of the second etch stop layer 174. For example, a first dry etch process may be performed to remove exposed portions of the second etch stop layer 174. For example, if the second etch stop layer 174 includes a dielectric metal oxide material, a dry etch process may be used to etch the dielectric metal oxide material selective to the dielectric materials of the upper connection-level dielectric layer 176, the memory-level dielectric layer 170, the lower connection-level dielectric layer 110, the first etch stop layer 172, and the cap layer 108. The dry etch process(es) in FIGS. 12 and 13 as described may be performed to partially remove the upper connection-level dielectric layer 176 and the second etch stop layer 174, so as to form a first opening.

In some embodiments, the dry etch process may include etching implementing carbon tetrafluoride ($CF_4$), fluoroform ($CHF_3$) or other fluorinated gas(es) to etch by endpoint. In some embodiments, the dry etch process may additional or separately include plasma etching implementing Argon (Ar), oxygen ($O_2$) or other plasma bombardment techniques to reduce a bottom footing/bottom shrink at the exposed top surface of the first etch stop layer 172. The dry etch process may cause the sidewalls of the second etch stop layer 174 to be aligned with sidewalls of the upper connection-level dielectric layer 176, such that a width of the first via cavities 179 continuously and gradually decreases along a vertical length from the exposed portions of the mask layer 178 towards the exposed top surface of the first etch stop layer 172. For example, a bottom footing/bottom shrink of the first etch stop layer 172 may be reduced or otherwise removed through the dry etch process, such that the walls of the first etch stop layer 172 do not extend outwards from the walls of the upper connection-level dielectric layer 176 to create a planar ledge, or bottom footing/bottom shrink (as illustrated in FIG. 1). In some embodiments, the etch process may cause the sidewalls of the second etch stop layer 174 and the upper connection-level dielectric layer 176 to be coplanar and tapered at an angle inwards towards the memory material stack (130, 140, 146, 148).

Figure 14:
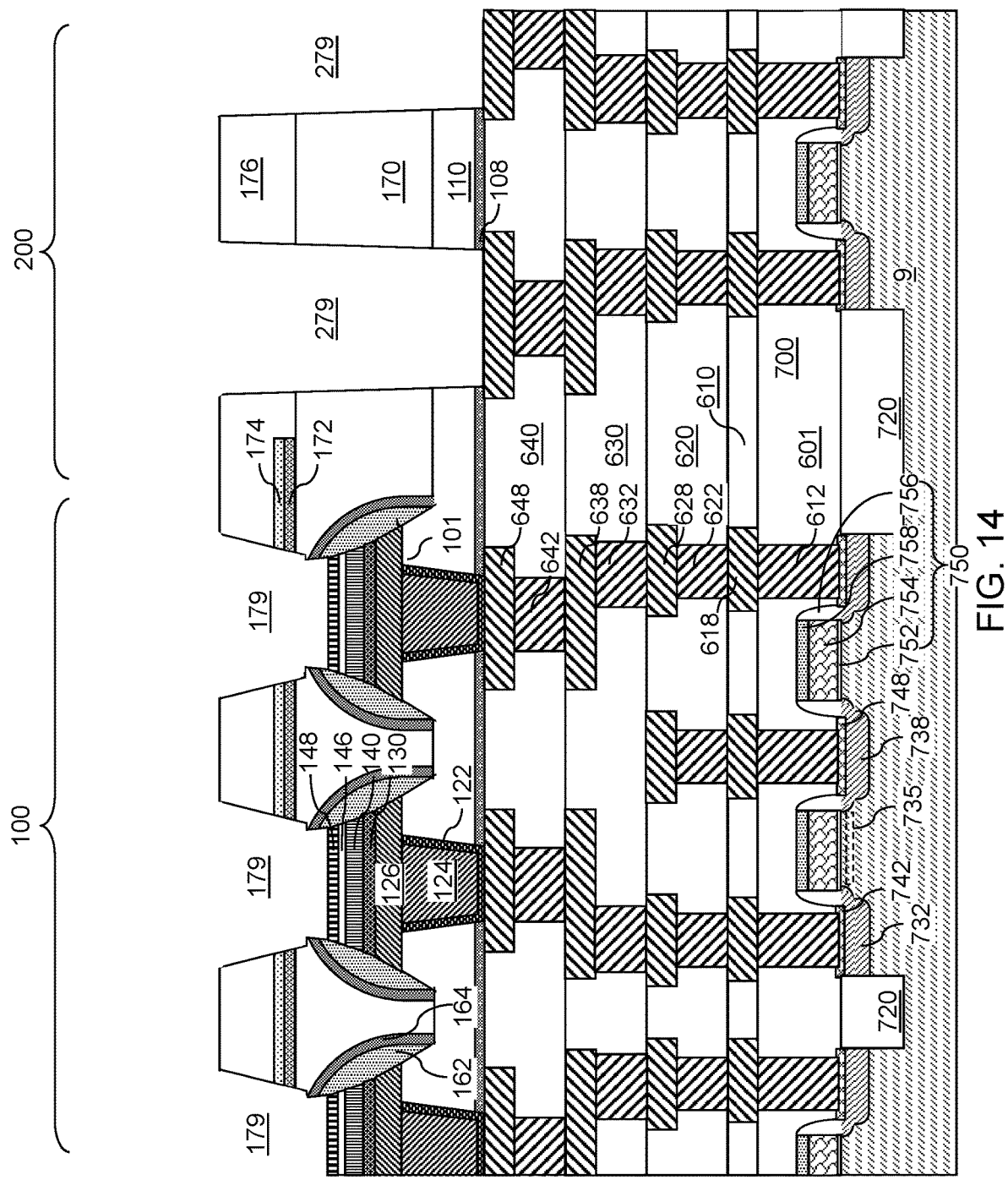
FIG. 14 is a vertical cross-sectional view of the exemplary structure after etching through exposed portions of a first etch stop layer and a top electrode according to an embodiment of the present disclosure.

FIG. 14 is a vertical cross-sectional view of the exemplary structure after etching through exposed portions of a first etch stop layer and a top electrode according to an embodiment of the present disclosure. Referring to FIG. 14, the first via cavities 179 and the second via cavities 279 may be vertically extended by etching exposed portions of the first etch stop layer 172, the cap layer 108, and the memory-level dielectric layer 170. For example, an anisotropic etch process may be performed to remove exposed portions of the first etch stop layer 172, the memory-level dielectric layer 170, and the cap layer 108 using the mask layer 178 (not shown). The chemistry of the anisotropic etch process may be selective to the materials of the top electrodes 158 and the second spacer portions 164. For example, the first etch stop layer 172 and the cap layer 108 may include silicon nitride and the memory-level dielectric layer 170 may include oxide, and the anisotropic etch process may include a reactive ion etch process that etches silicon nitride and oxide selective to the dielectric materials of the second spacer portions 164. In an illustrative example, the anisotropic etch process may include a reactive ion etch process using HBr, $CH_2H_2$, $CHF_3$, $CF_4$, $O_2$, $N_2$, $CH_xF_y$, Ar, He and/or other fluorinated gas(es) as process gases.

In some embodiments, an anisotropic etch process may be performed to remove exposed portions of the top electrodes 158 and the mask layer 178. The chemistry of the anisotropic etch process may be selective to the materials of the second spacer portions 164 and the memory-level dielectric layer 170. For example, the top electrodes 158 and the mask layer 178 may include TiN, and the anisotropic etch process may include a reactive ion etch process that etches TiN selective to the dielectric materials of the second spacer portions 164 and the memory-level dielectric layer 170. In an illustrative example, the anisotropic etch process may include a reactive ion etch process using chlorine ($Cl_2$) or other halogen gasses as process gases. The etch process(es) in FIG. 14 as described may be performed to partially remove the first etch stop layer 172, the top electrode 158, and the memory-level dielectric layer 170, so as to form a second opening that extends the dimensions of the first via cavities 179.

The etch process(es) performed to remove exposed portions of the first etch stop layer 172 and the cap layer 108 and to remove remnants of the top electrodes 158 and the mask layer 178 may result in the formation of larger first via cavities 179, such that the first via cavities 179 extend downwards towards an exposed top MTJ layer (148) of the array of memory cells (126, 130, 140, 146, 148). The etch process may cause the sidewalls of the first etch stop layer 172 and the memory-level dielectric layer 170 to be aligned with sidewalls of the second etch stop layer 174 and the upper connection-level dielectric layer 176, such that a width of the first via cavities 179 continuously and gradually decreases along a vertical length from the top of the upper connection-level dielectric layer 176 towards the exposed top surface (e.g., MTJ layer 148) of the array of memory cells (126, 130, 140, 146, 148).

In some embodiments, the etch process may cause the sidewalls of the first etch stop layer 172, the memory-level dielectric layer (170), the second etch stop layer 174, and the upper connection-level dielectric layer 176 to be coplanar and tapered at an angle inwards towards the memory material stack (130, 140, 146, 148). In embodiments in which the memory-level dielectric layer 170 is not in contact with the top electrodes 158 (i.e. spacer (162, 164) extends vertically to the surface of the memory-level dielectric layer 170 to separate the top electrodes 158 from the memory-level dielectric layer 170), the etch process may cause the sidewalls of the first etch stop layer 172, the second etch stop layer 174, and the upper connection-level dielectric layer 176 to be coplanar and tapered at an angle inwards towards the memory material stack (130, 140, 146, 148) (i.e. the memory-level dielectric layer 170 is not affected by the same etch process).

The aligned walls of the first etch stop layer 172, the memory-level dielectric layer 170, the second etch stop layer 174, and the upper connection-level dielectric layer 176 may form a periphery of the first via cavities 179. In some embodiments, the etching process may expose a respective portion of the spacer (162, 164), such that a periphery of the first via cavities 179 may be partially defined by the exposed portions of the spacers (162, 164). For example, dimensions of the first via cavities 179 may be defined by the aligned walls of the first etch stop layer 172, the memory-level dielectric layer 170, the second etch stop layer 174, and the upper connection-level dielectric layer 176, and an exposed portion of the spacer (162, 164) that protrudes outwards into the first via cavities 179 beneath the memory-level dielectric layer 170. The periphery of the first via cavities 179 may overlie a top layer (e.g., 148) of the array of memory cells (126, 130, 140, 146, 148) after removal of the top electrodes 158. The periphery of the first via cavities 179 may be greater than, less than, or the same as, the area of an underlying top layer (e.g., 148) of the array of memory cells (126, 130, 140, 146, 148). The periphery of each of the first via cavities 179 may be located outside the sidewall of a spacer (162, 164), may be located inside the sidewall of a spacer (162, 164), or may coincide with the sidewall of a spacer (162, 164) in a plan view, i.e., a view along a vertical direction.

In one embodiment, each first via cavity 179 may have an upper portion that is laterally surrounded by the dielectric etch stop layers (172, 174) and the upper connection-level dielectric layer 176, and a downward-protruding portion that is laterally surrounded by a respective spacer (162, 164). In one embodiment, the downward-protruding portion may have a lesser lateral dimension than the upper portion of each first via cavity 179. In this embodiment, a horizontal top surface of a spacer (162, 164) and optionally a horizontal top surface of the second dielectric layer 170 may be exposed to each first via cavity 179.

Figure 15:
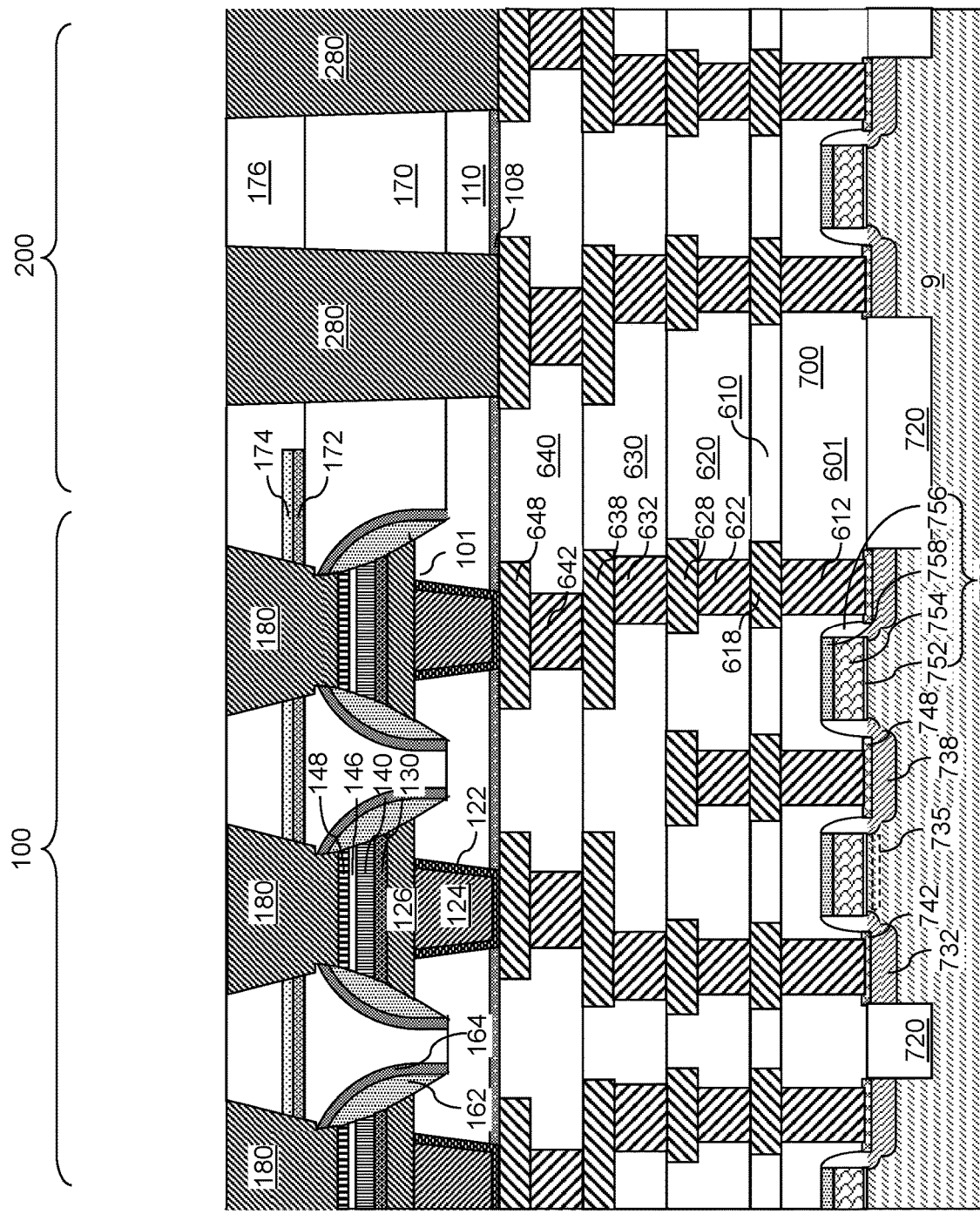
FIG. 15 is a vertical cross-sectional view of the exemplary structure after deposition of a metallic fill material layer in the via cavities according to an embodiment of the present disclosure.

FIG. 15 is a vertical cross-sectional view of the exemplary structure after deposition of a metallic fill material layer in the via cavities according to an embodiment of the present disclosure. Referring to FIG. 15, a metallic fill material layer 84L may be sequentially deposited in, and over, each of the via cavities (179, 279) to form metallic fill material portions. A metallic fill material layer (not shown) may include a metallic material that provides high electrical conductivity. For example, the metallic fill material layer may include an elemental metal or an intermetallic alloy of at least two elemental metals. In one embodiment, the metallic fill material layer may include W, Cu, Co, Ru, Mo, Al, alloys thereof, and/or a layer stack thereof. Other suitable materials within the contemplated scope of disclosure may also be used. The metallic fill material layer may be deposited by physical vapor deposition, chemical vapor deposition, electroplating, and/or electroless plating.

A chemical mechanical planarization (CMP) process may be performed to remove portions of the metallic fill material layer that overlie a horizontal plane including the top surface of the upper connection-level dielectric layer 176. Each remaining portion of the metallic fill material layer that fills a first via cavity 179 forms a conductive contact structure 180. Each remaining portion of the metallic fill material layer that fills a second via cavity 279 forms a conductive contact structure 280. The top surfaces of the conductive contact structures (180, 280) may be within the same horizontal plane as the top surface of the upper connection-level dielectric layer 176.

In some embodiments, the metallic fill material layer used to form each conductive contact structure 180 may be deposited/disposed over a previously deposited metallic barrier layer (not shown). Each metallic barrier layer may be a patterned portion of the metallic barrier layer as deposited in a manner similar to the metallic fill material layer according to the processing steps of FIG. 15.

Generally, the conductive contact structures 180 may be formed by depositing at least one conductive material in the first via cavities 179, and the conductive contact structures 280 may be formed by depositing the at least one conductive material in the second via cavities 279. Each conductive contact structure 180 may be formed directly on a top surface of a respective top MTJ layer (e.g., 148) of the array of memory cells (126, 130, 140, 146, 148), and within a respective first via cavity 179. An array of conductive contact structures 180 may be formed on the respective top surfaces of a respective top MTJ layer (e.g., 148) of the array of memory cells (126, 130, 140, 146, 148) in the array of the first via cavities 179. The conductive contact structures 180 may be formed to act as top electrodes for the respective array of memory cells (126, 130, 140, 146, 148). For example, each MTJ memory cell (126, 130, 140, 146, 148, 180) may include a bottom electrode 126, a magnetic tunnel junction structure (140, 146, 148), and a conductive contact structure 180 operating as the top electrode of the MTJ memory cell, such that the conductive contact structure 180 replaces and extends further than the top electrode 158 that was removed as previously described.

Figure 16:
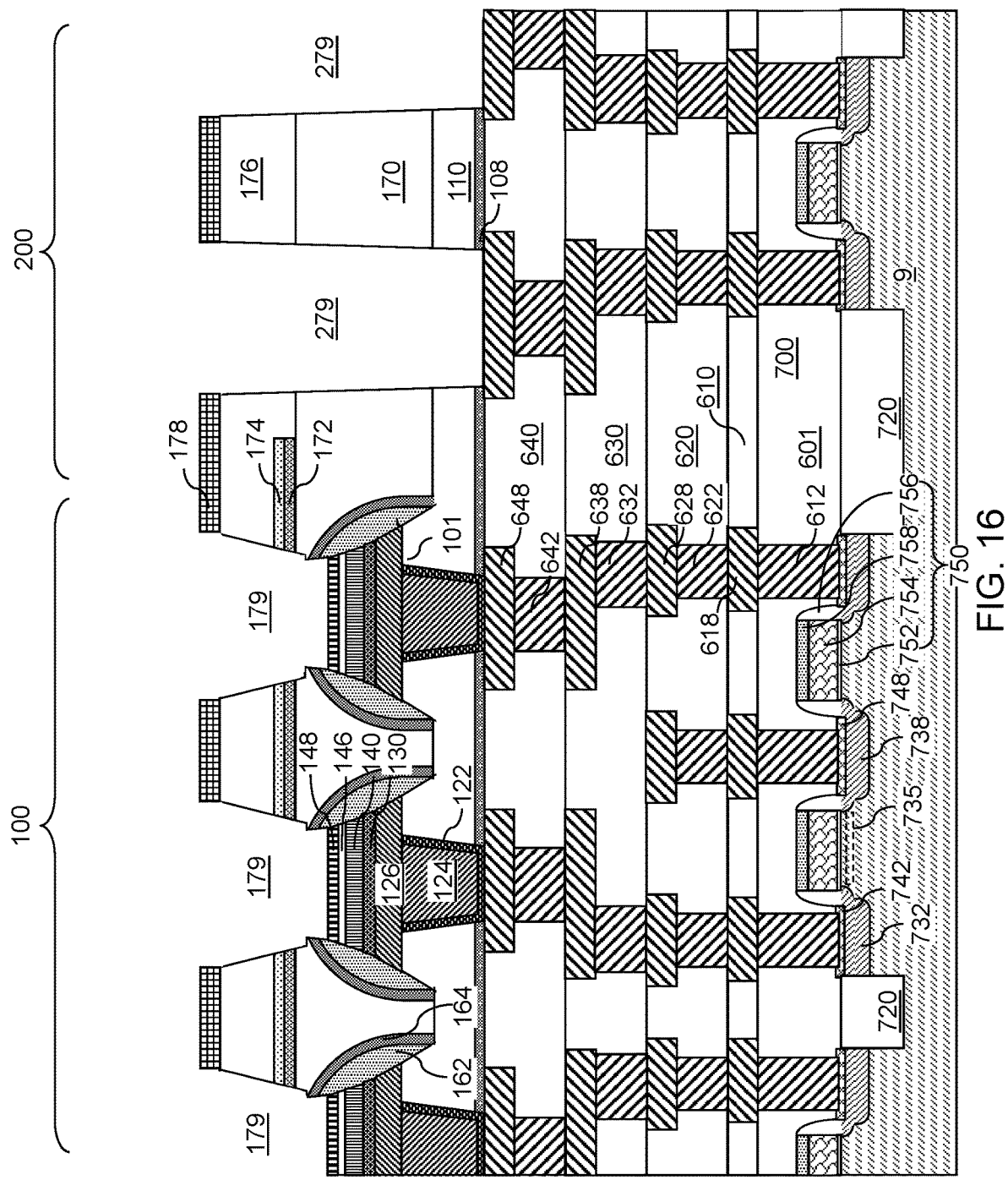
FIG. 16 is a vertical cross-sectional view of a first alternative embodiment of the exemplary structure after exposing top surfaces of the memory cells underneath the array of via cavities according to an embodiment of the present disclosure.

FIG. 16 is a vertical cross-sectional view of a first alternative embodiment of the exemplary structure after exposing top surfaces of the memory cells (126, 130, 140, 146, 148) underneath the array of via cavities 179 according to an embodiment of the present disclosure. Referring to FIG. 16, a first alternative embodiment of the exemplary structure may be derived from the exemplary structure of FIGS. 13 and 14 by performing one or more dry etching process that removes the first etch stop layer 172 and the top electrodes 158 while retaining at least a portions of the mask layer 178. The chemistry of the anisotropic etch process(es) may be selective to the materials of the mask layer 178. For example, the anisotropic etch process may include a reactive ion etch process that etches materials of the first etch stop layer 172 and the top electrodes 158 selective to the materials of the mask layer 178. In some embodiments in which the top electrodes 158 and the mask layer 178 are comprised of the same material (e.g., TiN), the etch process may be controlled to retain portions or all of the mask layer 178 while etching away portions or all of the top electrodes 158.

The etch process(es) performed to remove exposed portions of the first etch stop layer 172 and the top electrodes 158 may result in the formation of larger first via cavities 179, such that the first via cavities 179 extend downwards towards an exposed top MTJ layer (148) of the array of memory cells (126, 130, 140, 146, 148). The etch process may cause the sidewalls of the first etch stop layer 172 and the memory-level dielectric layer 170 to be aligned with sidewalls of the second etch stop layer 174 and the upper connection-level dielectric layer 176, such that a width of the first via cavities 179 continuously and gradually decreases along a vertical length from the top of the upper connection-level dielectric layer 176 towards the exposed top surface (e.g., MTJ layer 148) of the array of memory cells (126, 130, 140, 146, 148).

In some embodiments, the etch process may cause the sidewalls of the first etch stop layer 172, the memory-level dielectric layer (170), the second etch stop layer 174, and the upper connection-level dielectric layer 176 to be coplanar and tapered at an angle inwards towards the memory material stack (130, 140, 146, 148). In embodiments in which the memory-level dielectric layer 170 is not in contact with the top electrodes 158 (i.e. spacer (162, 164) extends vertically to the surface of the memory-level dielectric layer 170 to separate the top electrodes 158 from the memory-level dielectric layer 170), the etch process may cause the sidewalls of the first etch stop layer 172, the second etch stop layer 174, and the upper connection-level dielectric layer 176 to be coplanar and tapered at an angle inwards towards the memory material stack (130, 140, 146, 148) (i.e. the memory-level dielectric layer 170 is not affected by the same etch process).

Figure 17:
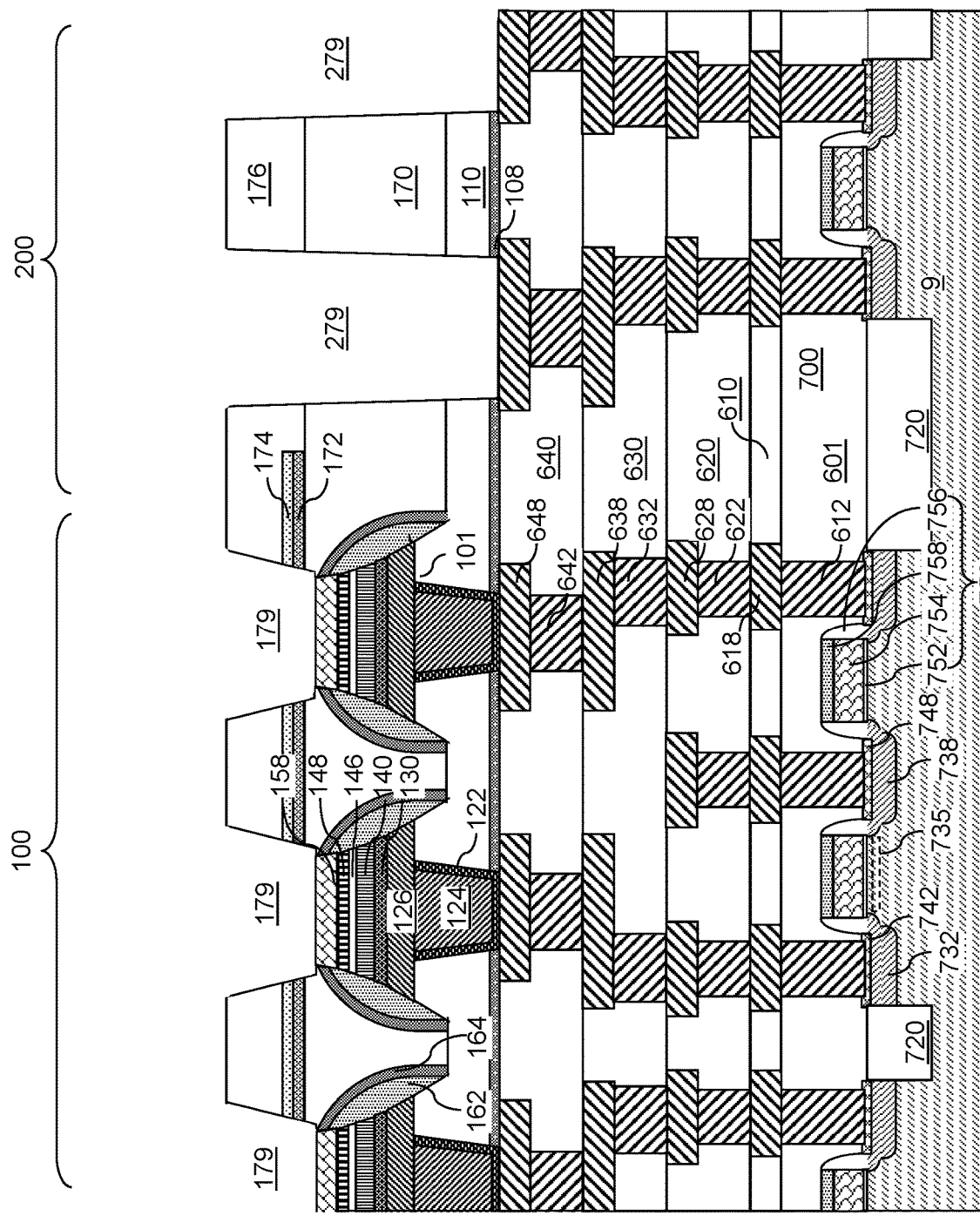
FIG. 17 is a vertical cross-sectional view of a second alternative embodiment of the exemplary structure after exposing top surfaces of top electrodes underneath the array of via cavities according to an embodiment of the present disclosure.

FIG. 17 is a vertical cross-sectional view of a second alternative embodiment of the exemplary structure after exposing top surfaces of top electrodes 158 underneath the array of via cavities 179 according to an embodiment of the present disclosure. Referring to FIG. 17, a second alternative embodiment of the exemplary structure may be derived from the exemplary structure of FIGS. 13 and 14 by performing one or more dry etching process that removes the first etch stop layer 172 and the mask layer 178 while retaining the top electrodes 158. The chemistry of the anisotropic etch process(es) may be selective to the materials of the top electrodes 158. For example, the anisotropic etch process may include a reactive ion etch process that etches materials of the first etch stop layer 172 and the mask layer 178 selective to the materials of the top electrodes 158. In some embodiments in which the top electrodes 158 and the mask layer 178 are comprised of the same material (e.g., TiN), the etch process may be controlled to retain portions or all of the top electrodes 158 while etching away portions or all of the and the mask layer 178. The conductive contact structures 180 may be formed over the top electrodes 158 to be in direct contact with the top electrodes 158.

The etch process(es) performed to remove exposed portions of the first etch stop layer 172 and the mask layer 178 may result in the formation of larger first via cavities 179, such that the first via cavities 179 extend downwards towards an exposed surface of the top electrodes 158. The etch process may cause the sidewalls of the first etch stop layer 172 and the second dielectric layer 170 to be aligned with sidewalls of the second etch stop layer 174 and the upper connection-level dielectric layer 176, such that a width of the first via cavities 179 continuously and gradually decreases along a vertical length from the top of the upper connection-level dielectric layer 176 towards the exposed top surface of the top electrodes 158.

In some embodiments, the etch process may cause the sidewalls of the first etch stop layer 172, the memory-level dielectric layer (170), the second etch stop layer 174, and the upper connection-level dielectric layer 176 to be coplanar and tapered at an angle inwards towards the top electrodes 158. In embodiments in which the memory-level dielectric layer 170 is not in contact with the top electrodes 158 (i.e. spacer (162, 164) extends vertically to the surface of the memory-level dielectric layer 170 to separate the top electrodes 158 from the memory-level dielectric layer 170), the etch process may cause the sidewalls of the first etch stop layer 172, the second etch stop layer 174, and the upper connection-level dielectric layer 176 to be coplanar and tapered at an angle inwards towards the top electrodes 158 (i.e. the memory-level dielectric layer 170 is not affected by the same etch process).

Methods may be used to complete the fabrication process of the MTJ structures illustrated in FIGS. 2-17 in conjunction with the conductive contact structures 180. The gradually decreasing (i.e. from a top surface to a bottom surface) width of a conductive contact structures (e.g., 180) formed within the peripheries of the first via cavities (e.g., 179), in conjunction with etching away a bottom shrink/bottom footing above a top layer (e.g., 148) of the respective array of memory cells (126, 130, 140, 146, 148), allow for reduced resistance within the MRAM loop. For example, the increased width of the periphery of the conductive contact structures through the removal of the bottom shrink/bottom footing allows for increased current flow. Replacing a top electrode (e.g., 158) comprising TiN in an MTJ memory cell with a single structure (e.g., conductive contact structures 180) comprising Cu that vertically extends beyond the dimensions of the replaced top electrode may result in a lower resistance path for the MRAM loop.

Figure 18:
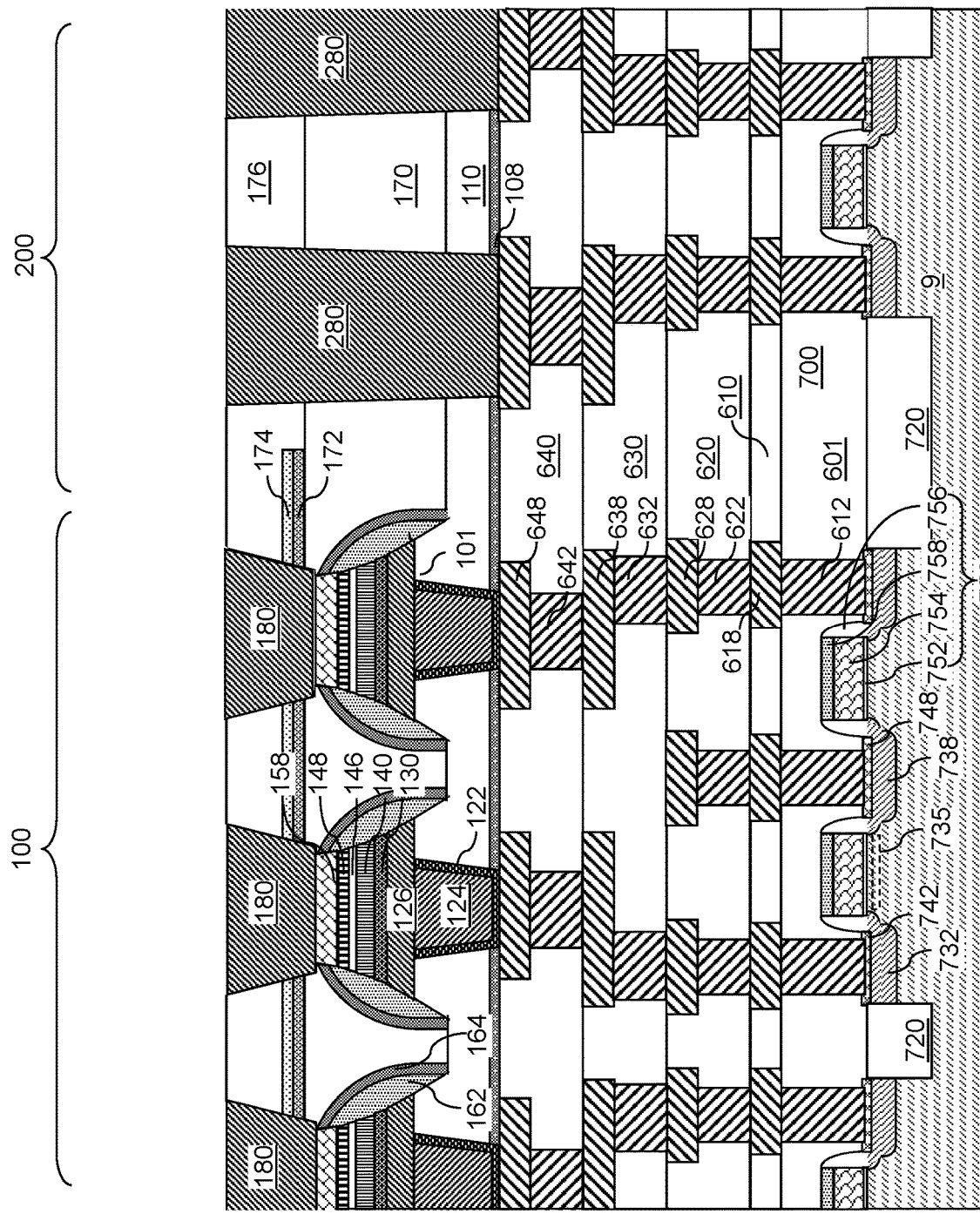
FIG. 18 is a vertical cross-sectional view of the second alternative embodiment of the exemplary structure after deposition of a metallic fill material layer in the via cavities according to an embodiment of the present disclosure.

FIG. 18 is a vertical cross-sectional view of the second alternative embodiment of the exemplary structure after deposition of a metallic fill material layer in the via cavities according to an embodiment of the present disclosure. Referring to FIG. 18, a metallic fill material layer may be sequentially deposited in, and over, each of the via cavities (179, 279) to form metallic fill material portions. A metallic fill material layer (not shown) may include a metallic material that provides high electrical conductivity. For example, the metallic fill material layer may include an elemental metal or an intermetallic alloy of at least two elemental metals. In one embodiment, the metallic fill material layer may include W, Cu, Co, Ru, Mo, Al, alloys thereof, and/or a layer stack thereof. Other suitable materials within the contemplated scope of disclosure may also be used. The metallic fill material layer may be deposited by physical vapor deposition, chemical vapor deposition, electroplating, and/or electroless plating.

A CMP process may be performed to remove portions of the metallic fill material layer that overlie a horizontal plane including the top surface of the upper connection-level dielectric layer 176. Each remaining portion of the metallic fill material layer that fills a first via cavity 179 forms a conductive contact structure 180. Each remaining portion of the metallic fill material layer that fills a second via cavity 279 forms a conductive contact structure 280. The top surfaces of the conductive contact structures (180, 280) may be within the same horizontal plane as the top surface of the upper connection-level dielectric layer 176.

In some embodiments, the metallic fill material layer used to form each conductive contact structure 180 may be deposited/disposed over a previously deposited metallic barrier layer (not shown). Each metallic barrier layer may be a patterned portion of the metallic barrier layer as deposited in a manner similar to the metallic fill material layer according to the processing steps of FIG. 18.

Generally, the conductive contact structures 180 may be formed by depositing at least one conductive material in the first via cavities 179, and the conductive contact structures 280 may be formed by depositing the at least one conductive material in the second via cavities 279. Each conductive contact structure 180 may be formed directly on a top surface of a respective top electrodes 158, and within a respective first via cavity 179. An array of conductive contact structures 180 may be formed on the respective top surfaces of respective top electrodes 158 in the array of the first via cavities 179. The conductive contact structure 180 may be formed such that the first etch stop layer 172, the second dielectric layer 170, the second etch stop layer 174, and the upper connection-level dielectric layer 176 surround the conductive contact structure as are all coplanar and tapered at an angle inwards towards the top electrodes 158.

Figure 19:
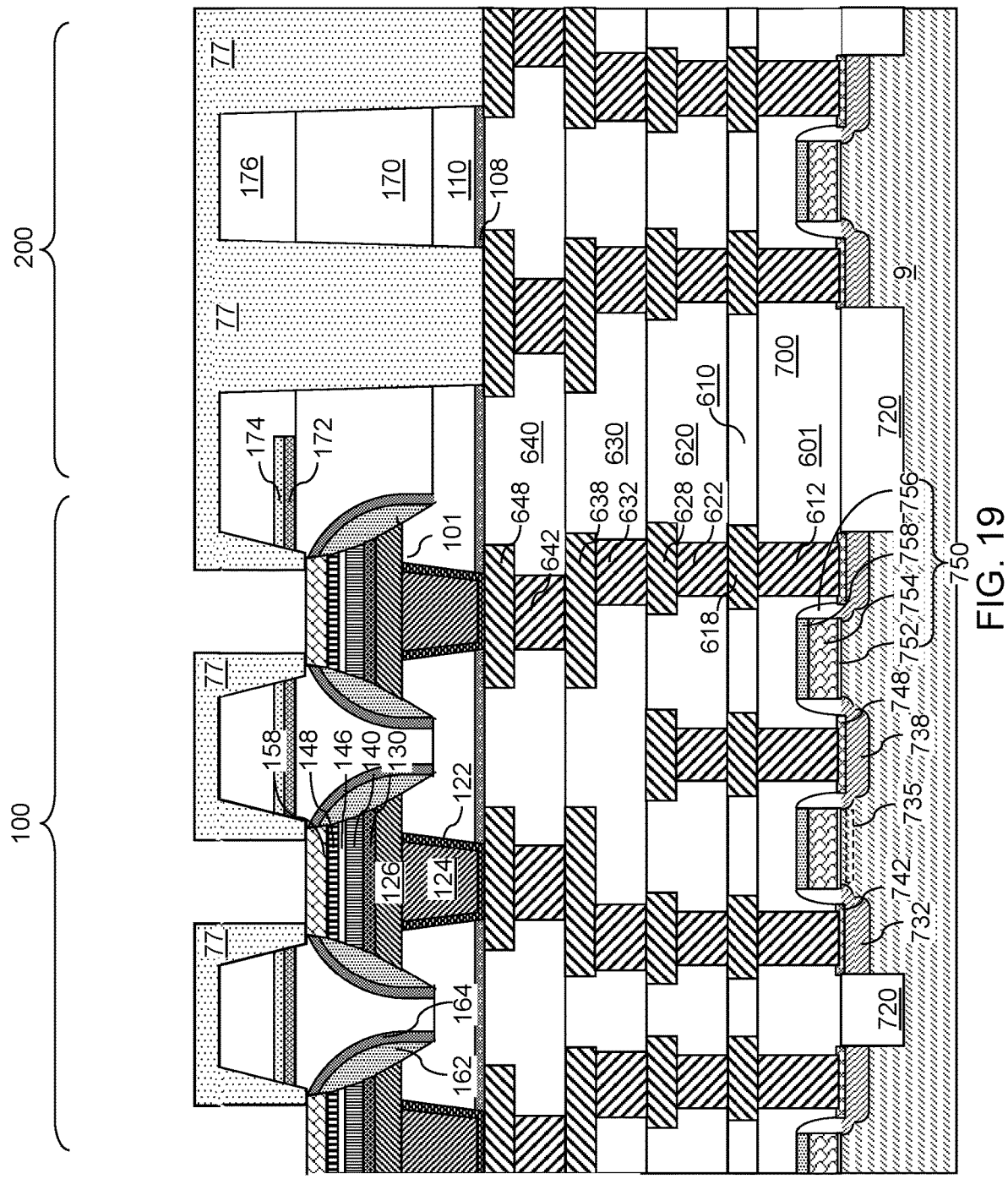
FIG. 19 is a vertical cross-sectional view of another alternative embodiment of the exemplary structure after depositing and patterning a photoresist layer.

FIG. 19 is a vertical cross-sectional view of another alternative embodiment of the exemplary structure after depositing and patterning a photoresist layer 177. Referring to FIG. 19, a photoresist layer 177 may be deposited over the intermediary structure illustrated in FIG. 17. In particular, a photoresist layer 177 may be deposited over the upper connection-level dielectric layer 176, in first via cavities 179 and in second via cavities 279. The photoresist layer 177 may be photolithographically patterned to expose portions of top electrodes 158 within first via cavities 179 while remaining to mask other portions of the upper connection-level dielectric layer 176 and second via cavities 279.

Figure 20:
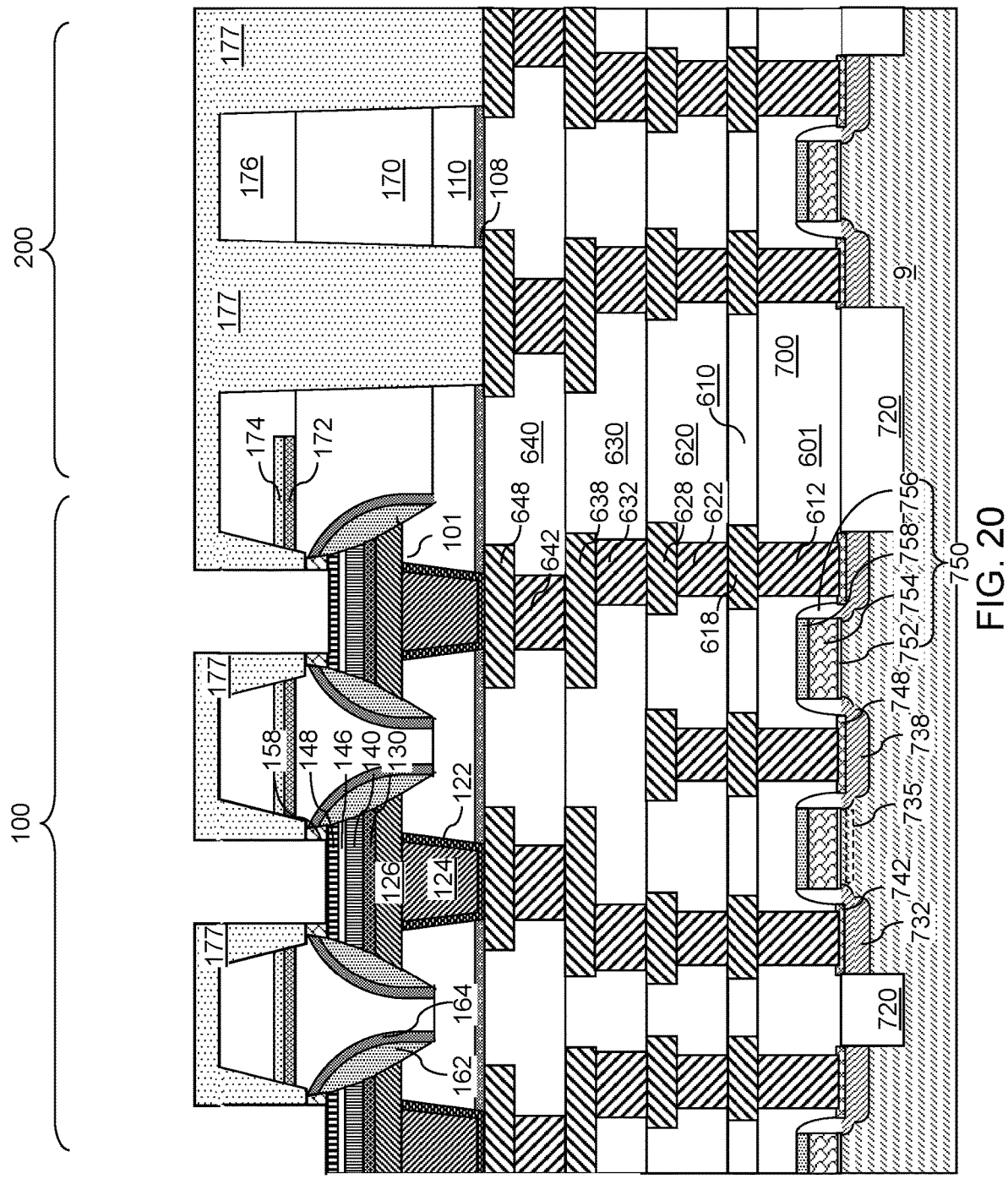
FIG. 20 is a vertical cross-sectional view of another alternative embodiment of the exemplary structure after etching the top electrodes to expose at least a portion of the underlying free magnetization material layer.

FIG. 20 is a vertical cross-sectional view of another alternative embodiment of the exemplary structure after etching the top electrodes 158 to expose at least a portion of the underlying free magnetization material layer 148. The top electrode 158 may have a thickness in a range of 0-30 nm, although greater thicknesses may be used. An annular ring of top electrode 158 material may remain with exposed sidewalls. In some embodiments, the etching of the top electrodes 158 may be stopped before at least a portion of the underlying free magnetization material layer 148 is exposed. In such embodiments, a recessed top surface of the top electrodes 158 and sidewalls of the top electrodes 158 may be exposed. In such embodiments, additional surface area of the top electrode 158 may be provided to contact subsequentially deposited conductive contact structures 180. For example, the recess in the top electrode 158 may be 0-30 nm. Thus, the sidewalls of the top electrode 158 may have a depth between 0-30 nm.

Figure 21:
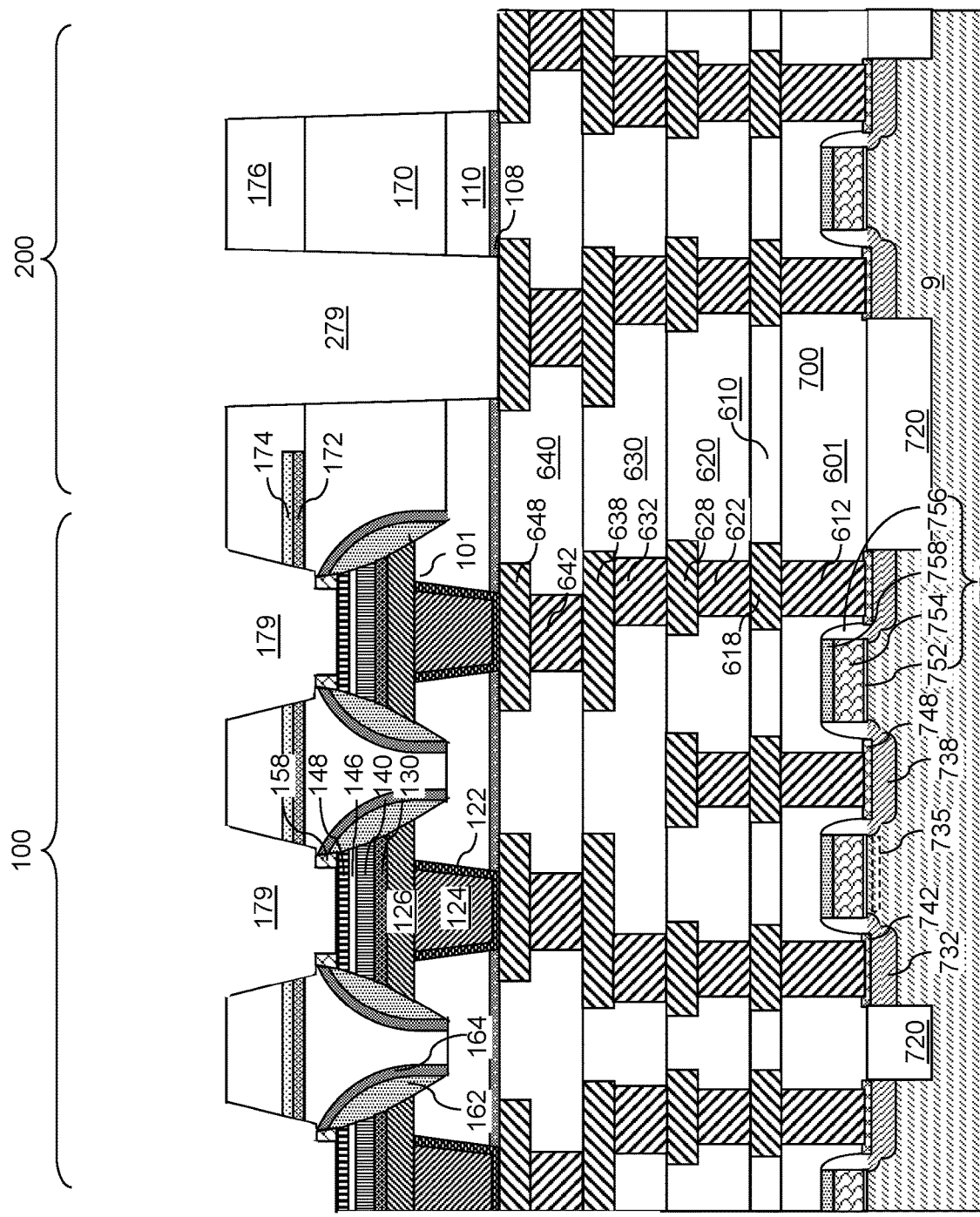
FIG. 21 is a vertical cross-sectional view of another alternative embodiment of the exemplary structure after the photoresist layer may be removed.
Figure 22:
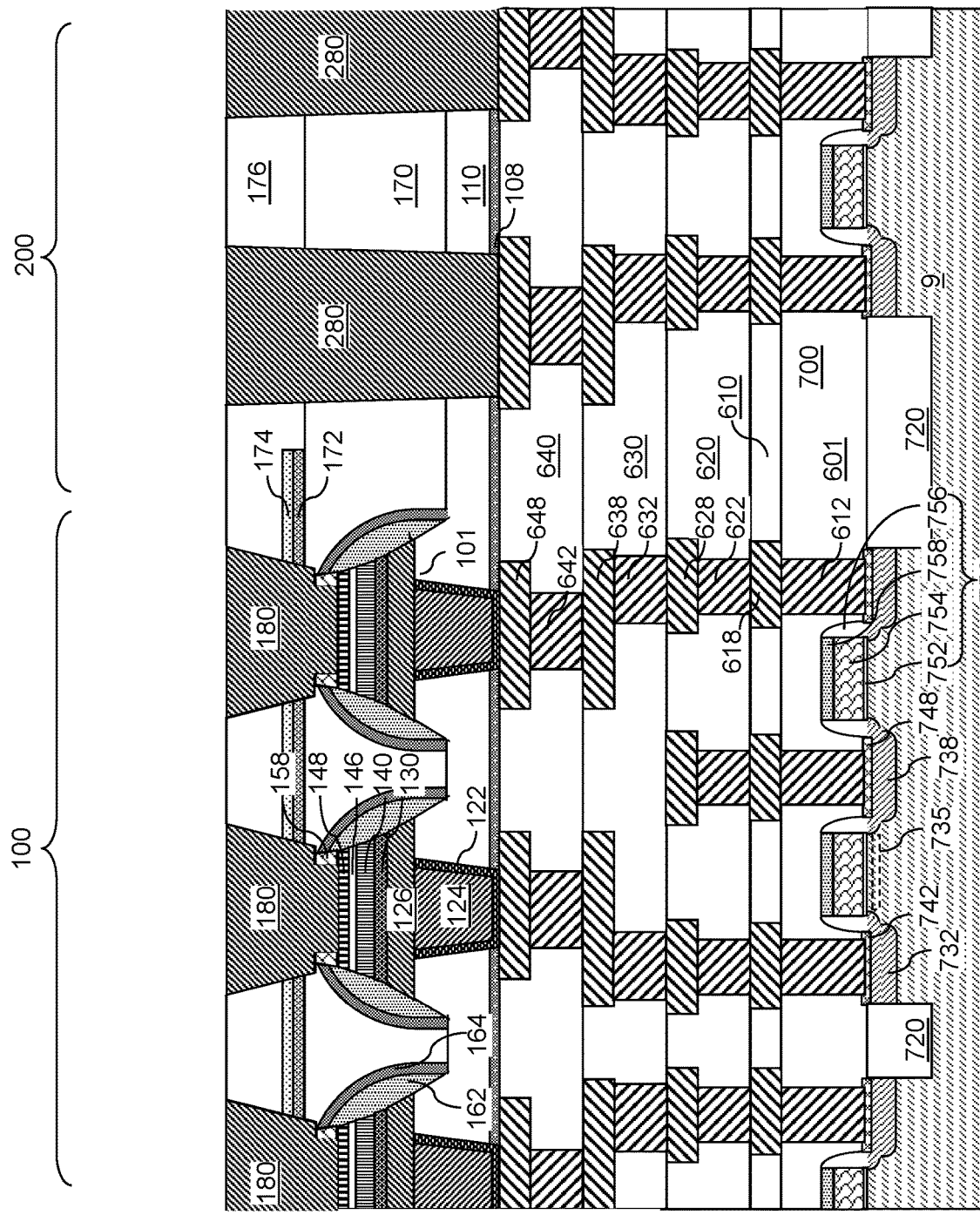
FIG. 22 is a vertical cross-sectional view of another alternative embodiment of the exemplary structure after deposition of a metallic fill material layer in the via cavities according to an embodiment of the present disclosure.

FIG. 21 is a vertical cross-sectional view of another alternative embodiment of the exemplary structure after the photoresist layer 177 may be removed, for example by ashing. FIG. 22 is a vertical cross-sectional view of another alternative embodiment of the exemplary structure after deposition of a metallic fill material layer in the via cavities according to an embodiment of the present disclosure. Referring to FIG. 22, a metallic fill material layer may be sequentially deposited in, and over, each of the via cavities (179, 279) to form metallic fill material portions. A metallic fill material layer (not shown) may include a metallic material that provides high electrical conductivity. For example, the metallic fill material layer may include an elemental metal or an intermetallic alloy of at least two elemental metals. In one embodiment, the metallic fill material layer may include W, Cu, Co, Ru, Mo, Al, alloys thereof, and/or a layer stack thereof. Other suitable materials within the contemplated scope of disclosure may also be used. The metallic fill material layer may be deposited by physical vapor deposition, chemical vapor deposition, electroplating, and/or electroless plating.

A CMP process may be performed to remove portions of the metallic fill material layer that overlie a horizontal plane including the top surface of the upper connection-level dielectric layer 176. Each remaining portion of the metallic fill material layer that fills a first via cavity 179 forms a conductive contact structure 180. Each of the conductive contact structures 180 may be surrounded by an annular ring of the top electrode material 158. In some embodiments, the metallic fill material may contact top electrode 158 material in the bottom of the first via cavity 170 such that the metallic fill material contacts tope electrode 158 material along the sidewalls and bottom surface of the conductive contact structures 180. Each remaining portion of the metallic fill material layer that fills a second via cavity 279 forms a conductive contact structure 280. The top surfaces of the conductive contact structures (180, 280) may be within the same horizontal plane as the top surface of the upper connection-level dielectric layer 176.

In some embodiments, the metallic fill material layer used to form each conductive contact structure 180 may be deposited/disposed over a previously deposited metallic barrier layer (not shown). Each metallic barrier layer may be a patterned portion of the metallic barrier layer as deposited in a manner similar to the metallic fill material layer according to the processing steps of FIG. 18.

Generally, the conductive contact structures 180 may be formed by depositing at least one conductive material in the first via cavities 179, and the conductive contact structures 280 may be formed by depositing the at least one conductive material in the second via cavities 279. Each conductive contact structure 180 may be formed directly on a top surface of a respective top electrodes 158, and within a respective first via cavity 179. An array of conductive contact structures 180 may be formed on the respective top surfaces of respective top electrodes 158 in the array of the first via cavities 179. The conductive contact structure 180 may be formed such that the first etch stop layer 172, the second dielectric layer 170, the second etch stop layer 174, and the upper connection-level dielectric layer 176 surround the conductive contact structure as are all coplanar and tapered at an angle inwards towards the top electrodes 158.

Figure 23:
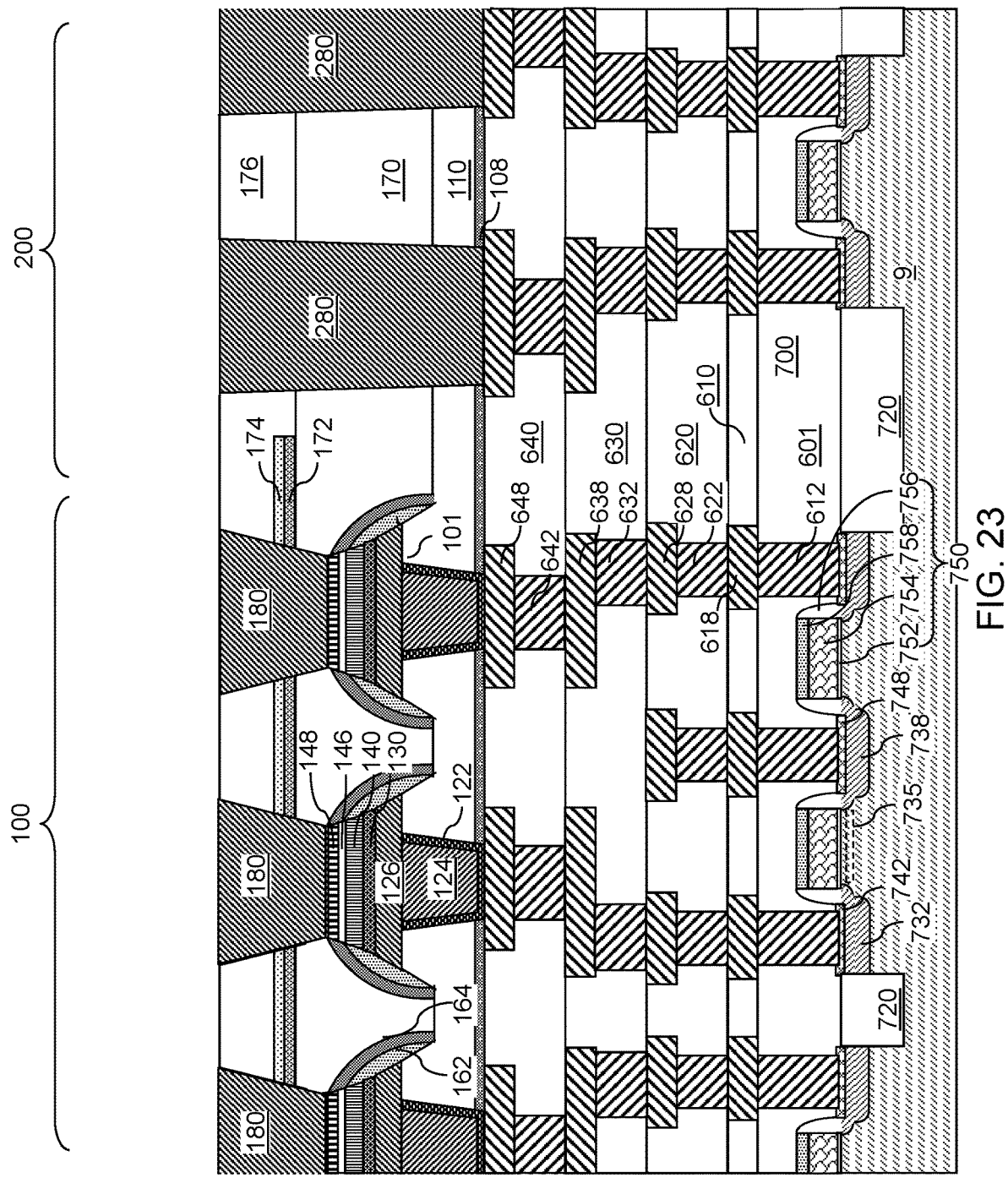
FIG. 23 is a vertical cross-sectional view of another alternative embodiment of the exemplary structure after depositing the conductive contact structure for forming an MTJ memory cell.

FIG. 23 is a vertical cross-sectional view of another alternative embodiment of the exemplary structure after depositing the conductive contact structure 180 for forming an MTJ memory cell (126, 130, 140, 146, 148, 180). In this embodiment, the dielectric spacer (162, 164) may be at a same vertical height as the top layer of the memory material stack (130, 140, 146, 148), such that the topmost portion of the dielectric spacer (162, 164) may be at a same level as the top surface of the free magnetization material layer 148L that is in direct contact with the conductive contact structure 180. In some embodiments, a CMP process may be performed to align the top surface of the top layer of the memory material stack (130, 140, 146, 148) with the topmost portions of the dielectric spacer (162, 164) before depositing the conductive contact structure 180 material.

Figure 24:
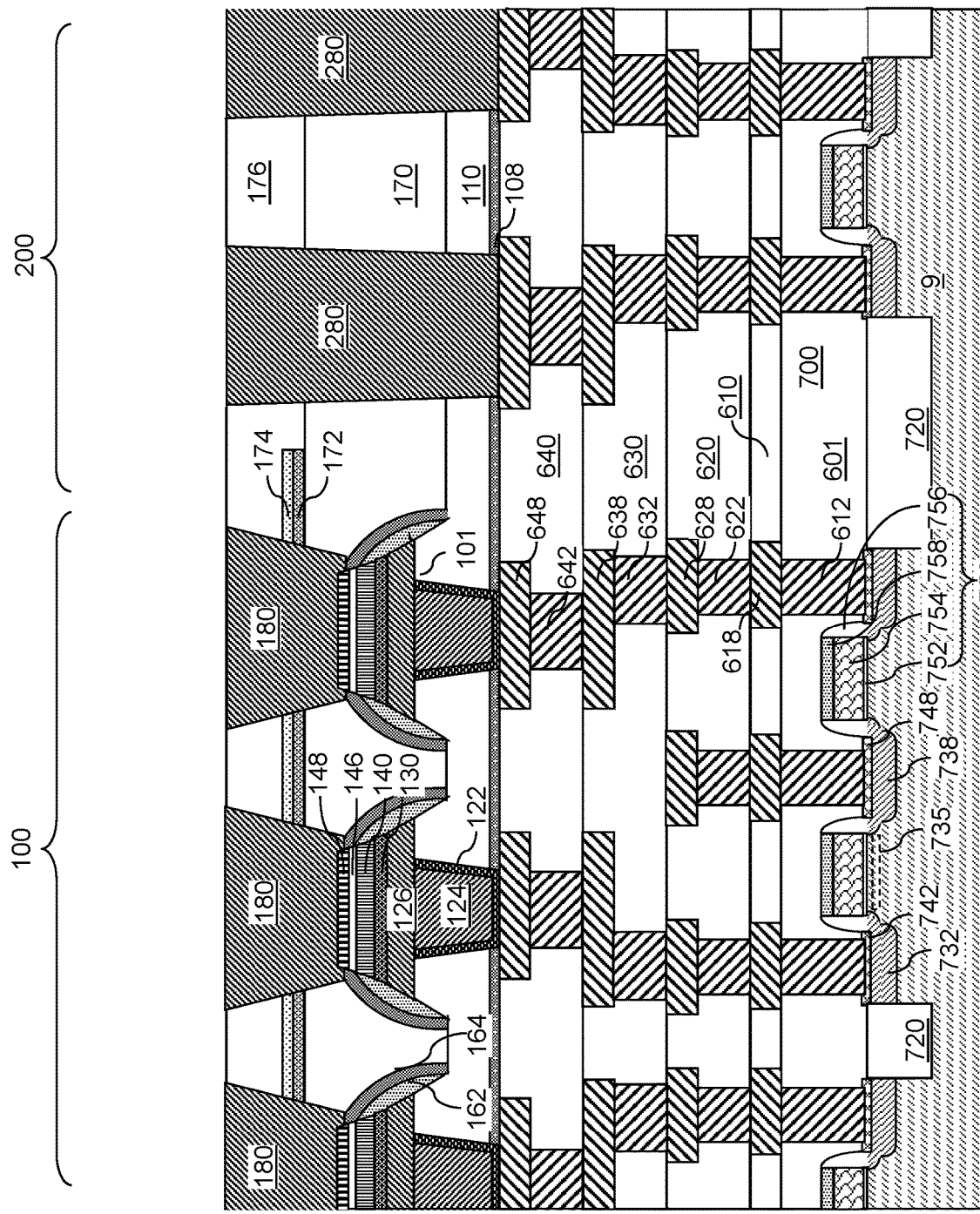
FIG. 24 is a vertical cross-sectional view of another alternative embodiment of the exemplary structure after depositing the conductive contact structure for forming an MTJ memory cell.

FIG. 24 is a vertical cross-sectional view of another alternative embodiment of the exemplary structure after depositing the conductive contact structure 180 for forming an MTJ memory cell (126, 130, 140, 146, 148, 180). In this embodiment, the conductive contact structure 180 may be deposited onto the top layer of the memory material stack (130, 140, 146, 148) and exposed portions of the dielectric spacer (162, 164). For example, the bottom surface of the conductive contact structure 180 may be wider than the top layer of the memory material stack (130, 140, 146, 148), and may be deposited on topmost exposed portions of the dielectric spacer (162, 164) in addition to the top layer of the memory material stack (130, 140, 146, 148).

Figure 25:
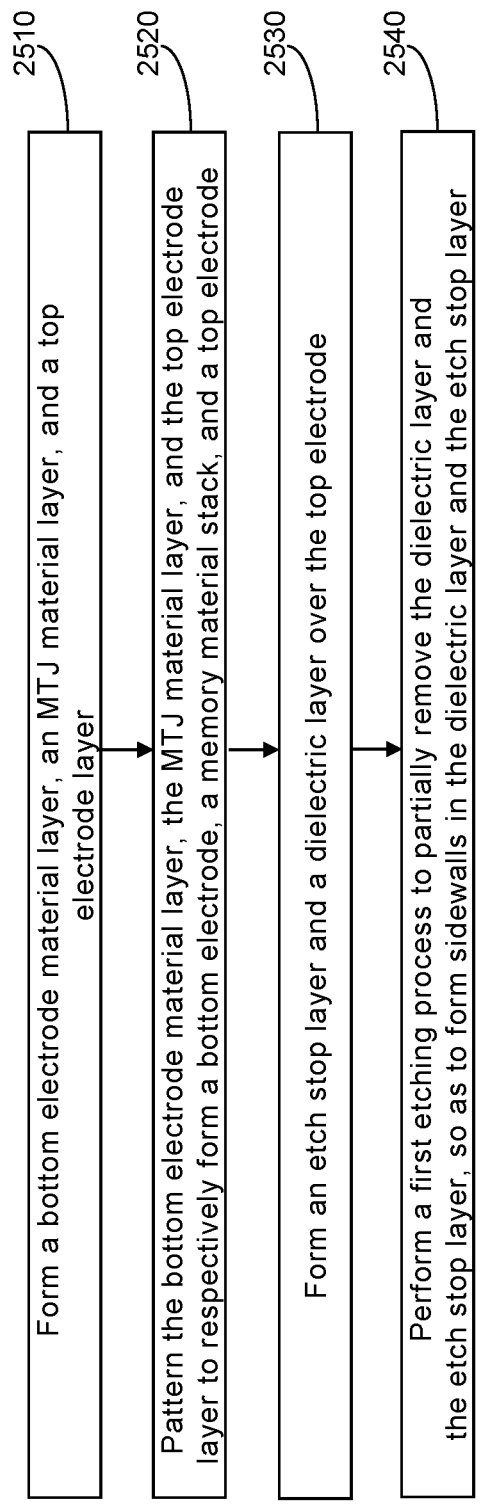
FIG. 25 is a flowchart that illustrates the general processing steps of the methods of the present disclosure.

Referring to FIG. 25, a flowchart illustrates the general processing steps of the methods of the present disclosure for forming a single memory device including a magnetic tunnel junction memory cell (126, 130, 140, 146, 148) and a contact via structure 180 therefor. A memory device may be formed by this method. Referring to step 2510 and FIG. 4, a bottom electrode material layer (126L), a magnetic tunnel junction (MTJ) material layer (130L, 140L, 146L, 148L), and a top electrode layer (158L) may be sequentially formed over the connection via structure (122, 124). Referring to step 2520 and FIGS. 5 and 6, the bottom electrode material layer (126L), the MTJ material layer (130L, 140L, 146L, 148L), and the top electrode layer (158L) may be patterned to respectively form a bottom electrode (126), a memory material stack (130, 140, 146, 148), and a top electrode (158). Referring to step 2530 and FIG. 10, an etch stop layer (172 and/or 174) and an upper connection-level dielectric layer (176) may be sequentially formed over the top electrode (158). Referring to step 2540 and FIGS. 11-13, a first etching process may be performed to partially remove the dielectric layer (176) and the etch stop layer (172 and/or 174), so as to form sidewalls in the dielectric layer (176) and the etch stop layer (172 and/or 174). In some embodiments, sidewalls of the etch stop layer (172 and/or 174) and sidewalls of the dielectric layer (176) may be coplanar and tapered at an angle inwards towards the top electrode (158).

In one embodiment, referring to FIG. 14, a second etching process may be performed to remove the top electrode (158). In one embodiment, the second etching process may be performed using at least one of $Cl_2$, $CHF_3$, or Ar.

In one embodiment, referring to FIG. 15, a conductive material may be deposited in a via cavity formed in the etch stop layer (172 and/or 174) and the upper connection-level dielectric layer (176) to form a conductive contact structure (180). In one embodiment, the conductive contact structure (180) may be comprised of Cu.

In one embodiment, referring to FIG. 15, a conductive material may be deposited in a via cavity formed in the etch stop layer (172 and/or 174) and the upper connection-level dielectric layer (176) to form a conductive contact structure (180). In one embodiment, the conductive contact structure (180) may be comprised of Cu.

In one embodiment, the method may further include forming a dielectric spacer (162, 164) around walls of the bottom electrode (126), the memory cell (130, 140, 146, 148), and the top electrode (158), in which an inner sidewall of the dielectric spacer (162, 164) may be exposed during a second etching process, and in which the conductive contact structure (180) may contact an inner sidewall of the dielectric spacer (162, 164).

In one embodiment, the method may further include performing a chemical mechanical planarization (CMP) process to form a planar surface including an exposed top surface of the conductive contact structure (180) and an exposed top surface of the upper connection-level dielectric layer (176), in which the exposed top surface of the conductive contact structure (180) is in a same horizontal plane as the exposed top surface of the dielectric layer (176).

In one embodiment, the method may further include depositing a mask layer (178) over the upper connection-level dielectric layer (176), in which the sidewalls of the etch stop layer (172 and/or 174) and the sidewalls of the dielectric layer (176) are formed in the first etching process based on a width of the mask layer (178). In one embodiment, a second etching process may be performed to remove the mask layer (178). In one embodiment, the mask layer (178) may be comprised of TiN. In one embodiment, the second etching process may be performed using at least one of $Cl_2$, $CHF_3$, or Ar.

In one embodiment, the method may further include depositing a mask layer (178) over the upper connection-level dielectric layer (176), in which the sidewalls of the etch stop layer (172 and/or 174) and the sidewalls of the dielectric layer (176) are formed in the first etching process based on a width of the mask layer (178). In one embodiment, a second etching process may be performed to remove the mask layer (178). In one embodiment, the mask layer (178) may be comprised of TiN. In one embodiment, the second etching process may be performed using at least one of $Cl_2$, $CHF_3$, or Ar.

In one embodiment, the top electrode (158) may be comprised of TiN. In one embodiment, the first etching process may be performed using at least one of carbon $CF_4$, $CHF_3$, Ar, or $O_2$.

Referring to all drawings and according to various embodiments of the present disclosure, a memory device is provided, which comprises a connection via structure (122, 124), a bottom electrode (126) disposed on the connection via structure (122, 124), a memory material stack (130, 140, 146, 148) disposed on the bottom electrode (126), a conductive contact structure (180) disposed on the memory material stack (130, 140, 146, 148), in which a bottom surface of the conductive contact structure (180) is in direct contact with a memory material layer (e.g., 148) of the memory material stack (130, 140, 146, 148), and in which sidewalls of the conductive contact structure (180) are in direct contact with sidewalls of an etch stop layer (172 and/or 174). In one embodiment, the conductive contact structure (180) may be comprised of Cu. In one embodiment, sidewalls of the conductive contact structure (180) may be in contact with sidewalls of an etch stop layer (172 and/or 174) and a dielectric layer (170 and/or 176). In one embodiment, the sidewalls of the etch stop layer (172 and/or 174) and the dielectric layer (170 and/or 176) may be coplanar and tapered at an angle inwards towards the memory material stack (130, 140, 146, 148). In one embodiment, the top surface of the conductive contact structure (180) may be in a same horizontal plane as a top surface of the upper connection-level dielectric layer (176). In one embodiment, a bottom surface of the conductive contact structure (180) may be disposed within a dielectric spacer (162, 164) that surrounds walls of the memory material stack (130, 140, 146, 148). In one embodiment, a bottom surface of the top electrode may be in contact with a top layer (148) of the MTJ memory cell (130, 140, 146, 148). In one embodiment, a width of the conductive contact structure (180) may continuously and gradually decrease from a top surface thereof toward the memory material stack (130, 140, 146, 148).

Referring to all drawings and according to various embodiments of the present disclosure, a memory device structure is provided, which comprises a connection via structure (122, 124), and a MTJ memory cell (126, 130, 140, 146, 148, 158) comprising a bottom electrode (126) disposed on the connection via structure (122, 124), a memory material stack (130, 140, 146, 148) disposed on the bottom electrode (126), and a top electrode (158) disposed on the memory material stack (130, 140, 146, 148). The memory device structure may further comprise an etch stop layer (172 and/or 174) disposed above the top electrode (158), in which sidewalls of the etch stop layer (172 and/or 174) surround a surround a conductive contact structure 180 disposed on the memory material stack (130, 140, 146, 148). The memory device structure may further comprise a dielectric layer (170 and/or 176) disposed above the top electrode (158), in which sidewalls of the dielectric layer (170 and/or 176) surround the conductive contact structure 180 disposed on the memory material stack (130, 140, 146, 148), and in which the sidewalls of the etch stop layer (172 and/or 174) and the dielectric layer (170 and/or 176) are coplanar and tapered at an angle inwards towards the top electrode (158). In one embodiment, the memory device structure may further comprise a conductive contact structure (180) disposed on the top electrode (158), in which a bottom surface of the conductive contact structure (180) is in contact with a top surface of the top electrode (158), and in which sidewalls of the conductive contact structure (180) are surrounded by the sidewalls of the etch stop layer (172 and/or 174) and the dielectric layer (170 and/or 176). In one embodiment, a width of the conductive contact structure (180) may continuously and gradually decrease from a top surface thereof toward the top electrode (158). In one embodiment, a top surface of the conductive contact structure (180) may be in a same horizontal plane as a top surface of the upper connection-level dielectric layer (176).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a connection via structure;
    a bottom electrode disposed on the connection via structure;
    a memory material stack disposed on the bottom electrode and comprising a magnetic tunnel junction which includes a free layer;
    a dielectric layer overlying the memory material stack; and
    a conductive contact structure vertically extending through the dielectric layer, and comprising:
        a metallic fill material;
        a bottom surface which is in direct contact with a top surface of the free layer; and
        a top surface which is located within a same horizontal plane as a top surface of the dielectric layer, said bottom surface being a bottom surface of said metallic fill material, and said top surface of the conductive contact structure being a top surface of said metallic fill material,
        wherein the conductive contact structure comprises an upper portion having a first sidewall and a lower portion having a second sidewall, and wherein a top periphery of the second sidewall is laterally offset inward relative to a bottom periphery of the first sidewall by a connecting surface segment such that a vertical cross-sectional view of the conductive contact structure has a stepped vertical cross-sectional profile in which a width of the conductive contact via structure increases stepwise along a vertical direction at the connecting surface segment.

2. The memory device of claim 1, wherein the conductive contact structure is comprised of copper (Cu).

3. The memory device of claim 1, wherein the first sidewall of the conductive contact structure is in contact with a sidewall of the dielectric layer.

4. The memory device of claim 3, further comprising an etch stop layer disposed between the dielectric layer and the memory material stack, wherein a sidewall of the etch stop layer and the first sidewall of the dielectric layer are coplanar and tapered at an angle inwards towards the memory material stack.

5. The memory device of claim 1, wherein a bottom surface of the conductive contact structure is disposed within a dielectric spacer that surrounds walls of the memory material stack.

6. The memory device of claim 1, wherein a width of the upper portion of the conductive contact structure continuously and gradually decreases from the top surface of the conductive contact structure toward the memory material stack.

7. The memory device of claim 1, further comprising an additional dielectric layer laterally surrounding the memory material stack and underlying the dielectric layer, wherein the first sidewall is in contact with a sidewall of the additional dielectric layer.

8. The memory device of claim 1, further comprising a top electrode comprising an opening therethrough and contacting a peripheral portion of the top surface of the free layer, wherein the second sidewall of the lower portion of the conductive via structure contacts a sidewall of the opening through the top electrode.

9. A memory device structure, comprising:
    a connection via structure;
    a magnetic tunnel junction (MTJ) memory cell comprising a magnetic tunnel junction which includes a free layer;
    an etch stop layer disposed above the MTJ memory cell;
    a dielectric layer disposed above the etch stop layer; and
    a conductive contact structure vertically extending through the dielectric layer and the etch stop layer, and comprising:
        a metallic fill material;
        a bottom surface which is in direct contact with a top surface of the free layer; and
        a top surface which is located within a same horizontal plane as a top surface of the dielectric layer, said bottom surface being a bottom surface of said metallic fill material, and said top surface of the conductive contact structure being a top surface of said metallic fill material,
        wherein the conductive contact structure comprises an upper portion having a first sidewall and a lower portion having a second sidewall, and wherein a top periphery of the second sidewall is laterally offset inward relative to a bottom periphery of the first sidewall by a connecting surface segment such that a vertical cross-sectional view of the conductive contact structure has a stepped vertical cross-sectional profile in which a width of the conductive contact via structure increases stepwise along a vertical direction at the connecting surface segment.

10. The memory device structure of claim 9, wherein the first sidewall of the upper portion of the conductive contact structure is surrounded by, and is in direct contact with, sidewalls of the etch stop layer and the dielectric layer.

11. The memory device of claim 9, wherein a width of the upper portion of the conductive contact structure continuously and gradually decreases from the top surface of the conductive contact structure toward the magnetic tunnel junction.

12. A manufacturing method of a memory device, comprising:
    forming a bottom electrode material layer, a magnetic tunnel junction (MTJ) material layer, and a top electrode layer;
    patterning the bottom electrode material layer, the MTJ material layer, and the top electrode layer to respectively form a bottom electrode, a memory material stack that comprises a magnetic tunnel junction which includes a free layer, and a top electrode;
    forming an etch stop layer and a dielectric layer over the top electrode; and forming a conductive contact structure through the dielectric layer and the etch stop layer, wherein the conductive contact structure comprises:
- a metallic fill material;
- a bottom surface that is formed directly on a top surface of the free layer; and
- a top surface which is formed within a same horizontal plane as a top surface of the dielectric layer, said bottom surface being a bottom surface of said metallic fill material, and said top surface of the conductive contact structure being a top surface of said metallic fill material,
- wherein the conductive contact structure comprises an upper portion having a first sidewall and a lower portion having a second sidewall, and wherein a top periphery of the second sidewall is laterally offset inward relative to a bottom periphery of the first sidewall by a connecting surface segment such that a vertical cross-sectional view of the conductive contact structure has a stepped vertical cross-sectional profile in which a width of the conductive contact via structure increases stepwise along a vertical direction at the connecting surface segment.

13. The manufacturing method of claim 12, wherein the top electrode is comprised of titanium nitride (TiN).

14. The manufacturing method of claim 12, further comprising performing a first etching process to partially remove the dielectric layer and the etch stop layer so as to form sidewalls in the dielectric layer and the etch stop layer, wherein the first etching process is performed using at least one of carbon tetrafluoride ($CF_4$), fluoroform ($CHF_3$), argon (Ar), or oxygen ($O_2$).

15. The manufacturing method of claim 14, wherein:
the first etching process forms a via cavity; and
the method further comprises depositing a conductive material in the via cavity formed in the etch stop layer and the dielectric layer to form the conductive contact structure.

16. The manufacturing method of claim 12, further comprising performing a second etching process to remove at least a portion of the top electrode.

17. The manufacturing method of claim 16, wherein the conductive contact structure is comprised of copper (Cu).

18. The manufacturing method of claim 12, further comprising depositing a mask layer over the dielectric layer, wherein the sidewalls of the etch stop layer and the sidewalls of the dielectric layer are formed in a first etching process based on a width of the mask layer, and wherein the mask layer is comprised of titanium nitride (TiN).

19. The manufacturing method of claim 18, further comprising performing a second etching process to remove the mask layer.

20. The manufacturing method of claim 19, wherein the second etching process is performed using at least one of chlorine ($Cl_2$), $CHF_3$, or Ar.

* * * * *